United States Patent
Kwon et al.

(10) Patent No.: US 10,713,778 B2
(45) Date of Patent: Jul. 14, 2020

(54) SEMICONDUCTOR DEFECT CLASSIFICATION DEVICE, METHOD FOR CLASSIFYING DEFECT OF SEMICONDUCTOR, AND SEMICONDUCTOR DEFECT CLASSIFICATION SYSTEM

(71) Applicant: Samsung Electronics Co., Ltd., Suwon-si, Gyeonggi-do (KR)

(72) Inventors: Namyeong Kwon, Suwon-si (KR); Hyohyeong Kang, Hwaseong-si (KR); Yongdeok Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 146 days.

(21) Appl. No.: 16/032,356

(22) Filed: Jul. 11, 2018

(65) Prior Publication Data
US 2019/0188840 A1    Jun. 20, 2019

(30) Foreign Application Priority Data
Dec. 19, 2017   (KR) ........................ 10-2017-0174886

(51) Int. Cl.
| | |
|---|---|
| *G06T 7/00* | (2017.01) |
| *G06N 3/08* | (2006.01) |
| *H01L 21/66* | (2006.01) |
| *G01N 21/95* | (2006.01) |
| *G06K 9/62* | (2006.01) |
| *G01N 21/956* | (2006.01) |
| *H01L 21/67* | (2006.01) |
| *G01N 21/88* | (2006.01) |

(52) U.S. Cl.
CPC ......... *G06T 7/001* (2013.01); *G01N 21/9501* (2013.01); *G01N 21/95607* (2013.01); *G06K 9/627* (2013.01); *G06N 3/08* (2013.01); *H01L 22/20* (2013.01); *G01N 2021/8854* (2013.01); *G06T 2207/10061* (2013.01); *G06T 2207/30148* (2013.01); *H01L 21/67288* (2013.01); *H01L 22/12* (2013.01)

(58) Field of Classification Search
CPC ................ G06T 7/001; G01N 21/9501; G01N 21/95607; G06K 9/627; G06N 3/08
USPC ........................................................ 382/149
See application file for complete search history.

(56) References Cited

U.S. PATENT DOCUMENTS

| | | | |
|---|---|---|---|
| 7,570,796 B2 | 8/2009 | Zafar | |
| 8,165,384 B1 * | 4/2012 | Ma | ........................ G06K 9/622 |
| | | | 382/149 |
| 8,824,773 B2 | 9/2014 | Minekawa | |

(Continued)

FOREIGN PATENT DOCUMENTS

| | | |
|---|---|---|
| JP | 5452392 | 3/2014 |
| JP | 2017032998 | 2/2017 |

(Continued)

*Primary Examiner* — Daniel G Mariam
(74) *Attorney, Agent, or Firm* — Myers Bigel, P.A.

(57) ABSTRACT

A semiconductor defect classification device includes feature extractors that are configured to receive images of semiconductor patterns on a wafer and to extract features of the images from the images, and a classifier that is configured to receive the features of the images and first meta information about the wafer and to use machine learning to classify a defect of the semiconductor patterns associated with the images based on the features of the images and the first meta information.

16 Claims, 15 Drawing Sheets

(56) References Cited

U.S. PATENT DOCUMENTS

| | | |
|---|---|---|
| 9,098,891 B2 | 8/2015 | Kulkarni |
| 9,710,903 B2 | 7/2017 | Fouquet |
| 9,727,799 B2 | 8/2017 | Park |
| 2014/0072204 A1* | 3/2014 | Minekawa ........... G01N 23/225 382/149 |
| 2016/0163035 A1 | 6/2016 | Chang |
| 2017/0082555 A1 | 3/2017 | He |
| 2017/0177997 A1 | 6/2017 | Karlinsky |
| 2017/0212168 A1 | 7/2017 | Leu |

FOREIGN PATENT DOCUMENTS

| | | |
|---|---|---|
| KR | 101285967 | 7/2013 |
| KR | 20150140349 | 12/2015 |
| KR | 20160076310 | 6/2016 |
| KR | 20170074812 | 6/2017 |
| KR | 20170091716 | 8/2017 |

* cited by examiner

SEMICONDUCTOR DEFECT CLASSIFICATION DEVICE, METHOD FOR CLASSIFYING DEFECT OF SEMICONDUCTOR, AND SEMICONDUCTOR DEFECT CLASSIFICATION SYSTEM

CROSS-REFERENCE TO RELATED APPLICATIONS

This application claims priority under 35 U.S.C. § 119 to Korean Patent Application No. 10-2017-0174886 filed on Dec. 19, 2017, in the Korean Intellectual Property Office, the entire contents of which are hereby incorporated herein by reference.

BACKGROUND

Embodiments of the inventive concept described herein relate to semiconductor devices, and, more particularly, to semiconductor defect classification devices, semiconductor defect classification methods, and semiconductor defect classification systems.

A semiconductor device is manufactured through various processes. As technology for designing semiconductor devices develops, the number of processes for manufacturing semiconductor devices may increase, and the complexity of each process may increase. As the number of processes and the complexity increase, various defects may occur in the process of manufacturing semiconductor devices.

A semiconductor defect may be detected with an intent to correct a cause of the semiconductor defect. One of the methods used for detecting a semiconductor defect is a visual method. According to the visual method, a semiconductor defect is classified based on one or more images of a semiconductor device.

Typically, a manager of a semiconductor manufacturing process may classify a semiconductor defect manually using the visual method. However, the accuracy or reliability of the defect classification by the manager may vary with the manager's skill in recognizing defects. Also, there may be time limitations associated with the visual method due to the cumulative fatigue of the manager.

SUMMARY

Embodiments of the inventive concept provide a semiconductor defect classification device, a semiconductor defect classification method, and a semiconductor defect classification system, for classifying a semiconductor defect without depending on human defect evaluation in the process of manufacturing a semiconductor device.

According to an example embodiment, a semiconductor defect classification device includes feature extractors that that are configured to receive images of semiconductor patterns on a wafer and to extract features of the images from the images, and a classifier that is configured to receive the features of the images and first meta information about the wafer and to use machine learning to classify a defect of the semiconductor patterns associated with the images based on the features of the images and the first meta information.

According to an example embodiment, a method of classifying a semiconductor defect includes receiving images of semiconductor patterns on a wafer, extracting features of the images from the images, receiving meta information associated with the images, and using machine learning to classify a defect of the semiconductor patterns based on the features and the meta information.

According to an example embodiment, a semiconductor defect classification system includes a manufacture device that is configured to generate semiconductor patterns in a wafer, an imaging device that is configured to generate images of the semiconductor patterns, a semiconductor defect classification device that is configured to use machine learning to perform defect classification on the images generated by the imaging device to classify a defect of the semiconductor patterns.

BRIEF DESCRIPTION OF THE FIGURES

The above and other objects and features of the inventive concept will become apparent by describing in detail example embodiments thereof with reference to the accompanying drawings.

DETAILED DESCRIPTION

Hereinafter, embodiments of the inventive concept will be described in detail with reference to the attached drawings. Like reference numbers signify like elements throughout the description of the figures. It is noted that aspects of the invention described with respect to one embodiment, may be incorporated in a different embodiment although not specifically described relative thereto. That is, all embodiments and/or features of any embodiment can be combined in any way and/or combination.

Semiconductor devices are manufactured by using a variety of different processes including, for example, etching polishing and the like. These processes, however, may generate defects in the various layers and regions making up the semiconductor devices. Some defect detection methods rely on human review and evaluation of images of the semiconductor devices, wafer, etc. The reliability of such a detection method may be dependent on the skill of the person reviewing the images and their state at the time of review. For example, if a person is tired when performing the review, a defect may be missed or misclassified. Some embodiments of the inventive concept may provide devices, systems, and methods that make use of machine learning build a knowledge database based on images of semiconductor patterns and to analyze images of semiconductor patterns along with other meta information to classify and identify potential defects in semiconductor devices. Upon detecting one or more defects, one or more processes and/or operations used in manufacturing or forming the devices on the semiconductor wafer may be altered to reduce the likelihood of future defects. In some embodiments, the changes to the semiconductor device manufacturing processes and operations may be automated in response to identification and/or classification of one or more defects. Such an automated defect detection and classification approach may provide both greater consistency and improved in identifying defects as compared to manual defect detection approaches.

Figure 1:
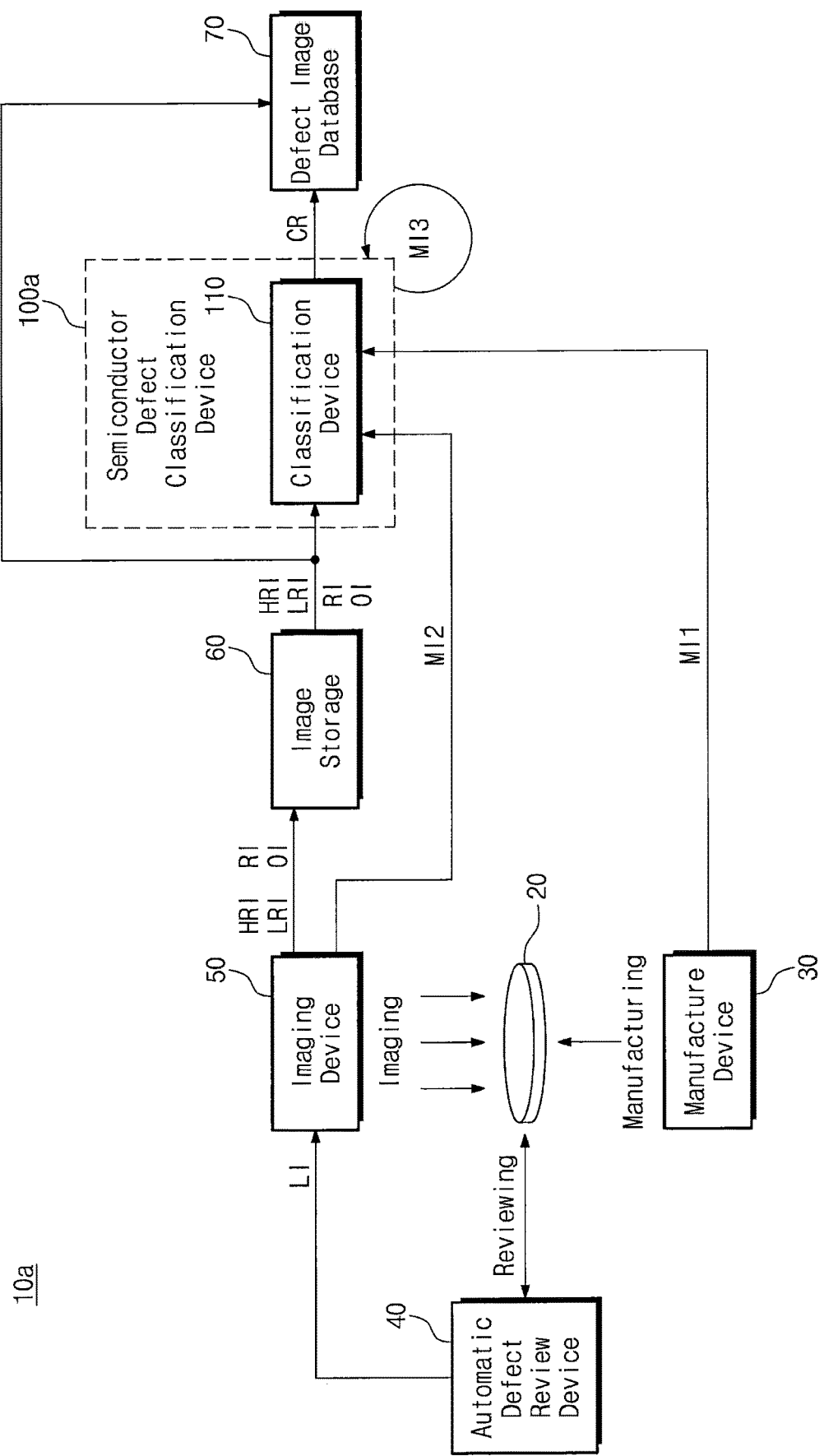
FIG. 1 is a block diagram illustrating a semiconductor defect classification system according to first embodiments of the inventive concept.

FIG. 1 is a block diagram illustrating a semiconductor defect classification system 10a according to first embodiments of the inventive concept. Referring to FIG. 1, the semiconductor defect classification system 10a includes a wafer 20, a manufacture device 30, an automatic defect review device 40, an imaging device 50, image storage 60, a defect image database 70, and a semiconductor defect classification device 100a.

The wafer 20 may be used as a substrate of semiconductor. For example, the wafer 20 may include a material having a semiconductor characteristic, such as, for example, silicon (Si), gallium arsenic (GaAs), etc. The manufacture device 30 may apply various processes for manufacturing semiconductors on the wafer 20.

For example, the manufacture device 30 may be configured to sequentially perform various processes, such as etching, deposition, planarization, etc., on the wafer 20. The manufacture device 30 may perform various processes on the wafer 20 to form various semiconductor patterns on the wafer 20.

The manufacture device 30 may be configured to output information about manufacturing the wafer 20 as first meta information MI1. For example, the first meta information MI1 may include information about a kind or type of the manufacture device 30, information about processing the wafer 20, information about a kind or type of a semiconductor device to be manufactured by processing the wafer 20, etc.

The first meta information MI1 may further include information about a kind of a process used by the manufacture device 30 to process the wafer 20. For example, the first meta information MI1 may include information about a kind of a process (or kinds of processes), which the manufacture device 30 applies to the wafer 20, between a previous review and a current review of the automatic defect review device 40 or between previous imaging and current imaging of the imaging device 50.

The first meta information MI1 may further include information about a process step which the manufacture device 30 performs with respect to the wafer 20. For example, the first meta information MI1 may include information regarding processes, which are performed on the wafer 20 until a current review of the automatic defect review device 40 or until current imaging of the imaging device 50, from among processes performed on the wafer 20.

The automatic defect review device 40 may be configured to review whether a defect is present in semiconductor patterns of the wafer 20. In accordance with various embodiments of the inventive concept, the review may be performed after each process is performed on the wafer 20, after a specific number of processes are performed, and/or after one of the processes designated as a review point is performed. The automatic defect review device 40 may be configured to transfer location information LI of a location (or locations) corresponding to a predicted defect location(s) to the imaging device 50.

The imaging device 50 may be configured to produce images of locations, which are predicted as locations where a defect is present in semiconductor patterns on the wafer 20, based on the location information LI. For example, the imaging device 50 may include an SEM (Scanning Electron Microscopy) device or an OM (Optical Microscopy) device.

The imaging device 50 may be configured to output a high resolution image HRI, a low resolution image LRI, and/or a reference image RI, based on the SEM imaging. The imaging device 50 may be configured to output an optical image OI based on the IM imaging.

The high resolution image HRI and the low resolution image LRI may be an image of a location predicted as a location(s) where one or more defects exist, that is, an image of a location based on the location information LI. The reference image RI may have the same resolution as the low resolution image LRI. The reference image RI may be an image of a location where a defect does not exist.

For example, the reference image RI may be an image of any location on the wafer 20, which is not associated with the location information LI. A location on the wafer 20, at which the reference image RI is captured, may be randomly selected by the imaging device 50 or may be designated by a manager.

The imaging device 50 may be configured to output information about the imaging device 50 and/or information about imaging semiconductor patterns of the wafer 20 as second meta information MI2. For example, the second meta information MI2 may include one or more of the following types of information including, but not limited to, information about a kind of the imaging device 50, information about a distance, a location, or an angle of the imaging device 50 upon taking images of the semiconductor patterns of the wafer 20, and information about locations on the wafer 20, which are estimated as having a defect.

The image storage 60 may be configured to store the high resolution image HRI, the low resolution image LRI, the reference image RI, and the optical image OI output from the imaging device 50. The image storage 60 may be configured to output the high resolution image HRI, the low resolution image LRI, the reference image RI, and the optical image OI in response to a request.

The image storage 60 may include one or more of a volatile memory, such as a dynamic random access memory (DRAM), or a static random access memory (SRAM), or a nonvolatile memory, such as a flash memory, a magnetic RAM (MRAM), a phase-change RAM (PRAM), a ferro-electric RAM (FRAM), or a resistive RAM (RRAM).

The semiconductor defect classification device 100a may receive the high resolution image HRI, the low resolution image LRI, the reference image RI, and the optical image OI from the image storage 60. The semiconductor defect classification device 100a may receive the first meta information MI1 from the manufacture device 30 and may receive the second meta information MI2 from the imaging device 50.

The semiconductor defect classification device 100a may be configured to classify (or determine), based on machine learning, semiconductor patterns of the wafer 20 associated with images having a defect, by using the high resolution image HRI, the low resolution image LRI, the reference image RI, the optical image OI, the first meta information MI1, the second meta information MI2, and/or third meta information MI3.

For example, the third meta information MI3 may include internal information associated with the machine learning of the semiconductor defect classification device 100a. The third meta information MI3 may include information about a creator generating trained data used in the machine learning capability of the semiconductor defect classification device 100a.

The semiconductor defect classification device 100a may include a classification device 110 that is configured to classify, based on the machine learning, defects by using the high resolution image HRI, the low resolution image LRI, the reference image RI, the optical image OI, and the first to third meta information MI1 to MI3. The classification device 110 may be configured to output a classification result CR.

For example, the machine learning may be made based on images of semiconductor patterns previously classified as having a defect. A classifier for classifying a defect or a normal state may be generated from the images of the semiconductor patterns based on a result of the machine learning. The classification device 110 may be loaded with a machine learning-based classifier and may perform classification on the images.

If the classification result CR indicates a defect, semiconductor patterns associated with the images are classified as having a defect. The classification result CR may be provided to the manager. If the classification result CR indicates a defect, the high resolution image HRI, the low resolution image LRI, the reference image RI, and the optical image OI may be stored in the defect image database 70.

If the classification result CR indicates a normal state, the semiconductor patterns associated with the images are classified as not having a defect. The classification result CR may be provided to the manager. If the classification result CR indicates a normal state, the high resolution image HRI, the low resolution image LRI, the reference image RI, and the optical image OI may not be stored in the defect image database 70.

The defect image database 70 may store images of semiconductor patterns classified as a defect by the semiconductor defect classification device 100a. If a learning condition is satisfied, the machine learning capability may be performed by using the images stored in the defect image database 70.

For example, a classifier loaded to the classification device 110 may be updated by the machine learning capability that uses the images stored in the defect image database 70. For example, the learning condition may be satisfied in one or more of a variety of says, such as, for example, when the number of images stored in the defect image database 70, a capacity of the images, or a time when the images are stored reaches a specific value or when the performance of the machine learning-based classification decreases. As another example, the learning condition may be satisfied under control of the manager.

Figure 2:
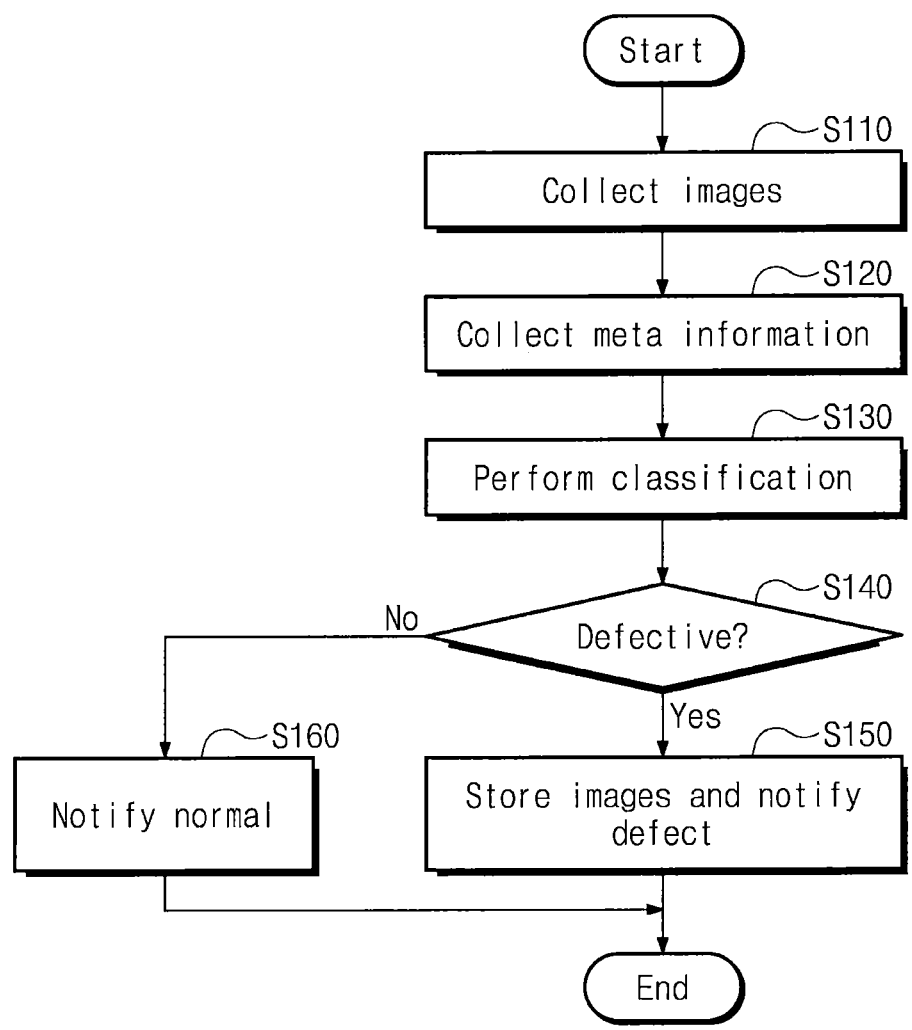
FIG. 2 is a flowchart illustrating operating methods of a semiconductor defect classification device according to some embodiments of the inventive concept.

FIG. 2 is a flowchart illustrating operations of the semiconductor defect classification device 100a according to some embodiments of the inventive concept. An example of classifying a defect of semiconductor patterns of one location of locations included in the location information LI is illustrated in FIG. 2.

Referring to FIGS. 1 and 2, at block S110, the semiconductor defect classification device 100a may collect images. For example, the semiconductor defect classification device 100a may collect the high resolution image HRI, the low resolution image LRI, the reference image RI, and the optical image OI.

For example, to perform defect classification, the classification device 110 of the semiconductor defect classification device 100a may generate one image by combining the high resolution image HRI, the low resolution image LRI, the reference image RI, and the optical image IO and may perform defect classification based on the generated image.

For another example, the classification device 110 of the semiconductor defect classification device 100a may receive the high resolution image HRI, the low resolution image LRI, the reference image RI, and the optical image OI and may perform defect classification by using the received images HRI, LRI, RI, and IO individually.

At block S120, the classification device 110 of the semiconductor defect classification device 100a may receive the first to third meta information MI1 to MI3. At block S130, the classification device 110 of the semiconductor defect classification device 100a may perform defect classification by using the high resolution image HRI, the low resolution image LRI, the reference image RI, the optical image OI, and the first to third meta information MI1 to MI3.

At block S140 a determination is made whether the classification result CR indicates a defect. If the classification result CR indicates a defect, then operations continue at block S150 where the high resolution image HRI, the low resolution image LRI, the reference image RI, and the optical image OI may be stored in the defect image database 70. Also, a notification indicating that the semiconductor patterns have a defect may be provided to the manager.

If it is determined at block S140 that the classification result CR does not indicate a defect, that is, that the classification result CR indicates a normal state, then operations continue at block S160 where a notification indicating that the semiconductor patterns do not have a defect may be provided to the manager.

An example where classification is made with respect to locations included in the location information LI is described with reference to FIG. 2. If the wafer 20 is replaced, the location information LI may be detected from the replaced wafer, and the classification described with reference to FIG. 2 may be made based on the location information LI.

According to some embodiments of the inventive concept, a defect is classified based on the machine learning to which the high resolution image HRI, the low resolution image LRI, the reference image RI, and the optical image OI are all applied. Accordingly, the reliability of defect classification that is made based on all of the high resolution image HRI, the low resolution image LRI, the reference image RI, and the optical image OI is improved compared with the reliability of defect classification that is made based on a part of the high resolution image HRI, the low resolution image LRI, the reference image RI, and the optical image OI.

According to some embodiments of the inventive concept, a defect is classified by using the first meta information MI1 associated with the manufacture device 30. Because a defect is classified by using a characteristic of the manufacture device 30 or a characteristic of a process applied to the wafer 20, the reliability of defect classification may be improved. Also, because information about a process step(s) is applied to defect classification, there is no need to provide a separate classifier for each process step.

According to some embodiments of the inventive concept, a defect is classified by using the second meta information MI2 associated with the imaging device 50. Because a defect is classified by using a characteristic of the imaging device 50 or a characteristic of an environment where imaging is made, the reliability of defect classification may be improved.

According to some embodiments of the inventive concept, a defect is classified by using the third meta information MI3 associated with a creator that generates data of the machine learning capability, for example, a classifier performing classification manually. Accordingly, because a tendency, capability, etc. of the creator are applied, the reliability of defect classification is improved.

Figure 3:
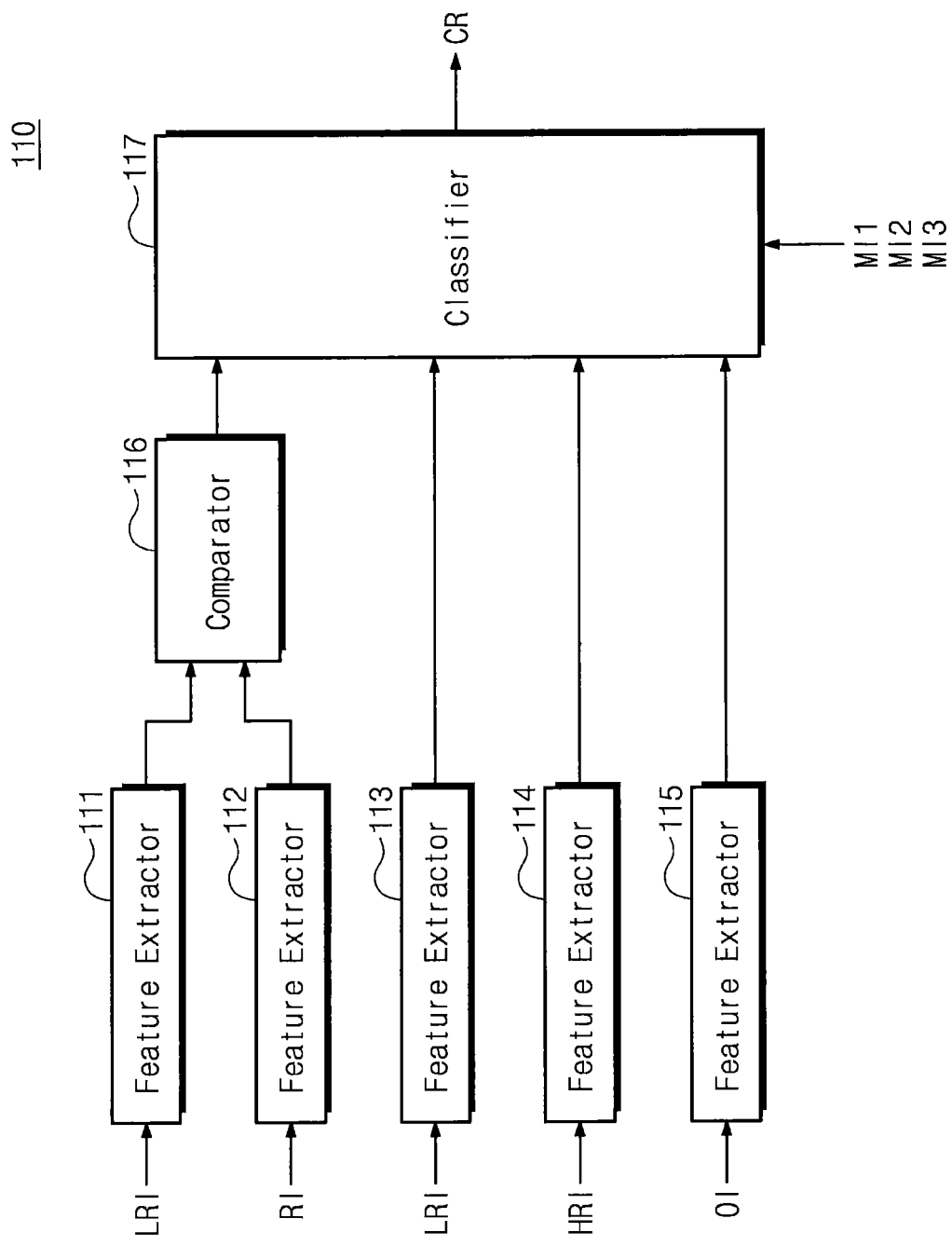
FIG. 3 is a block diagram illustrating an example of a classification device according to some embodiments of the inventive concept.

FIG. 3 is a block diagram illustrating an example of the classification device 110 according to some embodiments of the inventive concept. Referring to FIGS. 1 and 3, the classification device 110 includes first to fifth feature extractors 111 to 115, a comparator 116, and a classifier 117.

The first feature extractor 111 may be configured to extract a feature from the low resolution image LRI. For example, the first feature extractor 111 may extract a feature from the low resolution image LRI based on the machine learning. For example, the first feature extractor 111 may extract the feature of the low resolution image LRI by using a stacked convolutional neural network (CNN).

The second to fifth feature extractors 112 to 115 may be configured to extract features of the reference image RI, the low resolution image LRI, the high resolution image HRI, and the optical image OI by using the machine learning capability, such as, for example, the convolutional neural network (CNN). For example, a feature of each image may appear in the form of a space vector.

In some embodiments, the first and second feature extractors 111 and 112 are configured to extract features for comparison of the low resolution image LRI and the reference image RI. For appropriate comparison, the first and second feature extractors 111 and 112 may have the same characteristic (e.g., a structure of layers) and may use the same parameter (e.g., synapses).

The third to fifth feature extractors 113 to 115 may have characteristics the same as or different from the first and second feature extractors 111 and 112 and may use parameters the same as or different from the first and second feature extractors 111 and 112. The third to fifth feature extractors 113 to 115 may have characteristics the same as or different from each other and may use parameters the same as or different from each other.

The comparator 116 may be configured to compare a feature of the low resolution image LRI and a feature of the reference image RI. For example, the comparator 116 may detect a difference between the feature of the low resolution image LRI and the feature of the reference image RI. The comparison result of the comparator 116 may show only a difference between the feature of the low resolution image LRI and the feature of the reference image RI. Accordingly, even though the complexity of semiconductor patterns may be relatively high and the size of defects may be relatively small, the defect may be shown effectively.

In other embodiments, the classifier 117 may be configured to perform machine learning-based defect classification by using the features extracted by the third to fifth feature extractors 113 to 115 and the first to third meta information MI1 to MI3 without using the comparison result of the comparator 116.

The classifier 117 may receive an output of the comparator 116 and outputs of the third to fifth feature extractors 113 to 115. The classifier 117 may receive the first to third meta information MI1 to MI3. The classifier 117 may be configured to perform machine learning-based defect classification by using the output of the comparator 116, the outputs of the third to fifth feature extractors 113 to 115, and the first to third meta information MI1 to MI3.

The classifier 117 may be configured to output a result of performing the defect classification as the classification result CR. For example, the classifier 117 may perform defect classification based on at least one or more of various machine learning algorithms, such as, but not limited to, decision tree, neural network, support vector machine (SVM), etc.

In some embodiments of the inventive concept, the classifier 117 may be configured to perform defect classification by using the first to third meta information MI1 to MI3. However, in other embodiments, t classifier 117 may be configured to perform defect classification by using at least one of the first to third meta information MI1 to MI3.

Figure 4:
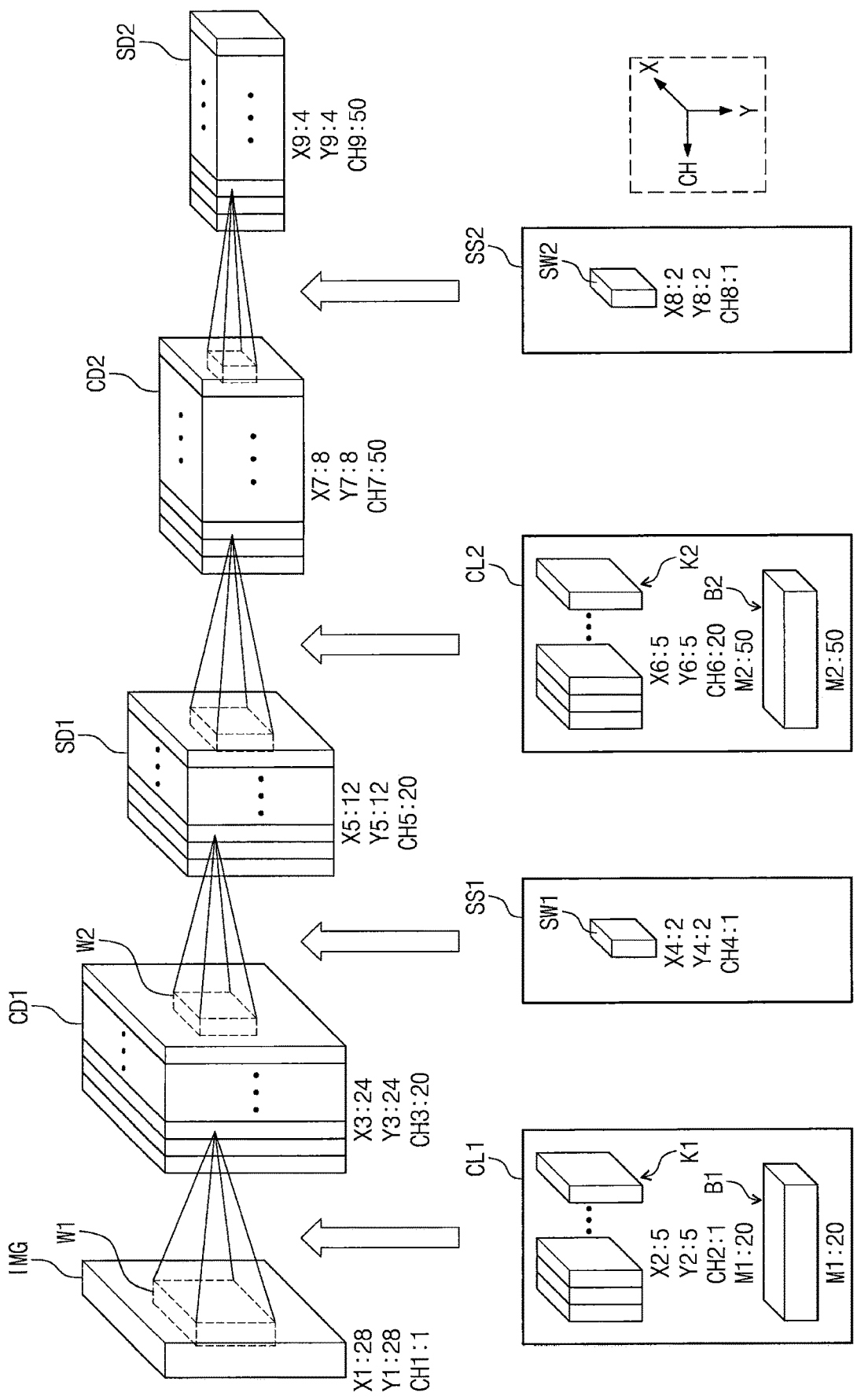
FIG. 4 illustrates an example in which a feature of one of the images is extracted by a plurality of layers of a convolutional neural network according to some embodiments of the inventive concept.

FIG. 4 illustrates an example in which a feature of one of the images (e.g., HRI, LRI, RI, and OI) is extracted by a plurality of layers of a convolutional neural network (CNN) according to some embodiments of the inventive concept. Below, each layer will be more fully described by using various numerical values, which are used for descriptive purposes only. The numerical values may be modified or changed based on a form of the input images or a stacked form of the convolutional neural network (CNN) and are not limiting of the inventive concept.

Referring to FIGS. 3 and 4, image data IMG may be of size 28×28×1 (28 wide (X1), 28 height (Y1), 1 channel (CH1)). For example, the size of the image data IMG may be measured by the number of items of pixel data.

A first convolution layer CL1 may be applied to the image data IMG. The first convolution layer CL1 may include first kernels K1 and a first bias B1. Each of the first kernels K1 may be of size 5×5×1 (5 wide (X2), 5 height (Y2), 1 channel (CH2)). The size of the channel CH2 of each of the first kernels K1 may be the same as the size of input data, that is, the size of the channel CH1 of the image data IMG.

The number M1 of the first kernels K1 may be "20." The number M1 of the first kernels K1 may be the same as the number of channels of data output through the first convolution layer CL1. For example, the size of the first kernels K1 may be measured by the number of synapses to be computed with the image data IMG. The first bias B1 may include 20 synapses, the number of which is the same as the number M1 of the first kernels K1.

When the first convolution layer CL1 is applied to the image data IMG, one kernel of the first kernels K1 may be selected. The selected kernel may be computed with the image data IMG as a first window W1. The first window W1 may move along a predefined direction on the image data IMG.

Below, a movement of various windows will be described by using the term "location". For example, a location of a window may indicate a location on input data corresponding to a specific synapse (e.g., a leftmost top synapse in a window) belonging to the window. For example, a location of a window may indicate that a specific synapse is overlapped with any pixel data of pixel data of input data in a horizontal direction "X" and in a vertical direction "Y".

For example, the first window W1 may move in the horizontal direction "X" (e.g., left to right) from a location of a first vertical direction "Y" selected. If the first window W1 moves to the rightmost side from the first vertical location selected, a location of a second vertical direction "Y" below a location of the first vertical direction "Y" selected may be selected. The first window W1 may move in the horizontal direction "X" (e.g., left to right) from a location of the second vertical direction "Y" selected.

At each location of the first window W1, pixel data of the image data IMG corresponding to the first window W1 and synapse data of synapses of the first window W1 may be computed. Synapse data of a synapse corresponding to a location of a kernel selected from the synapses of the first bias B1 may be added to or subtracted from the computation result. Data to which a bias is applied may form data (e.g., sample data) of one location of output data (e.g., first convolution data CD1).

For example, a location of a channel of the first convolution data CD1 where sample data are disposed may correspond to a location of a kernel selected from the first kernels K1. An X3×Y3 location of the first convolution data CD1 where sample data are disposed may correspond to a location on the image data IMG of the first window W1.

If synapses of one kernel of the first kernels K1 and one synapse of the first bias B1 are applied to the image data IMG, data of one channel of the first convolution data CD1 may be generated. If the 20 first kernels K1 are sequentially applied, 20 channels of the first convolution data CD1 may be sequentially generated. In an embodiment, the first kernels K1 may correspond to different image filters, respectively. The first convolution data CD1 may be a set of results obtained by applying 20 different filters.

Because a selected kernel is of size 5×5 (5 wide (X2), 5 height (Y5), the size of each channel of the first convolution data CD1 may be smaller than the size of the image data IMG. For example, according to a result of calculating a space where the first window W1 moves on the image data IMG with respect to a leftmost top point of the first window W1, the first window W1 may be disposed at 24 different locations in horizontal X1 and may be disposed at 24 different locations in vertical Y1.

Accordingly, the first convolution data CD1 may be of size 24×24×20 (24 wide (X3), 24 height (Y3), 20 channels (CH3)). For example, the size of the first convolution data CD1 may be measured by the number of items of sample data.

A first sub-sampling layer SS1 may be applied to the first convolution data CD1. The first sub-sampling layer SS1 may include a first sub-sampling kernel SW1. The first sub-sampling kernel SW1 may be of size 2×2×1 (2 wide (X4), 2 height (Y2), 1 channel (CH4)).

The first sub-sampling kernel SW1 may be selected as a second window W2. The second window W2 may move onto the first convolution data CD1. For example, the 20 channels of the first convolution data CD1 may be sequentially selected, and the second window W2 may move onto the selected channel.

In the selected channel, the second window W2 may move in the same manner as the first window W1. Sub-sampling may be performed at each location of the second window W2. For example, sub-sampling may include selecting data having the maximum value among data corresponding to each location of the second window W2.

A result of performing sub-sampling on a selected location of a selected channel may form one instance of data (e.g., sample data) of a corresponding location of a corresponding channel of output data (e.g., first sub-sampling data SD1) of the first sub-sampling layer SS1.

In an embodiment, a stride of the second window W2 may be set to "2". The stride may indicate a location difference upon moving from a current location to a next location when the second window W2 moves. For example, the stride may indicate a location difference between a first location and a second location just following the first location.

The first sub-sampling data SD1 may be of size 12×12×20 (12 wide (X5), 12 height (Y5), 20 channels (CH5)). For example, the size of the first sub-sampling data SD1 may be measured by the number of items of sample data. A second convolution layer CL2 may be applied to the first sub-sampling data SD1.

The second convolution layer CL2 may include second kernels K2 and a second bias B2. Each of the second kernels K2 may be of size 5×5×20 (5 wide (X6), 5 height (Y6), 20 channels (CH6)). The number M2 of the second kernels K2 may be "50". The second bias B2 may include 50 synapses corresponding to the number M2 of the second kernels K2.

The number of channels CH6 of each of the second kernels K2 is the same as the number of channels CH5 of the first sub-sampling data SD1. Accordingly, the second convolution layer CL2 may be applied to the first sub-sampling data SD1 in the same manner as the first convolution layer CL1.

For example, in a selected one kernel, pixel data corresponding to 20 channels and synapses corresponding to 20 channels may be computed at a specific location on the first sub-sampling data SD1. The second convolution layer CL2 may be applied to be the same as the first convolution layer CL1 except that the number of channels of pixel data and synapses computed at one location increases.

Result data obtained by applying the second convolution layer CL2 may be second convolution data CD2. The second convolution data CD2 may be of size 8×8×50 (8 wide (X7), 8 height (Y7), 50 channels (CH7)). The size of the second convolution data CD2 may be measured by the number of items of sample data.

A second sub-sampling layer SS2 may be applied to the second convolution data CD2. The second sub-sampling layer SS2 may include a second sub-sampling kernel SW2. The second sub-sampling kernel SW2 may be of size 2×2×1 (2 wide (X8), 2 height (Y8), 1 channel (CH8)). The second sub-sampling layer SS2 may be applied to the second convolution data CD2 in a manner that is the same as a manner where the first sub-sampling layer SS1 is applied to the first convolution data CD1.

Result data obtained by applying the second sub-sampling layer SS2 may be second sub-sampling data SD2. The second sub-sampling data SD2 may be of size 4×4×50 (4 wide (X9), 4 height (Y9), 50 channels (CH9)). The size of the second sub-sampling data SD2 may be measured by the number of pieces of sample data.

Figure 5:
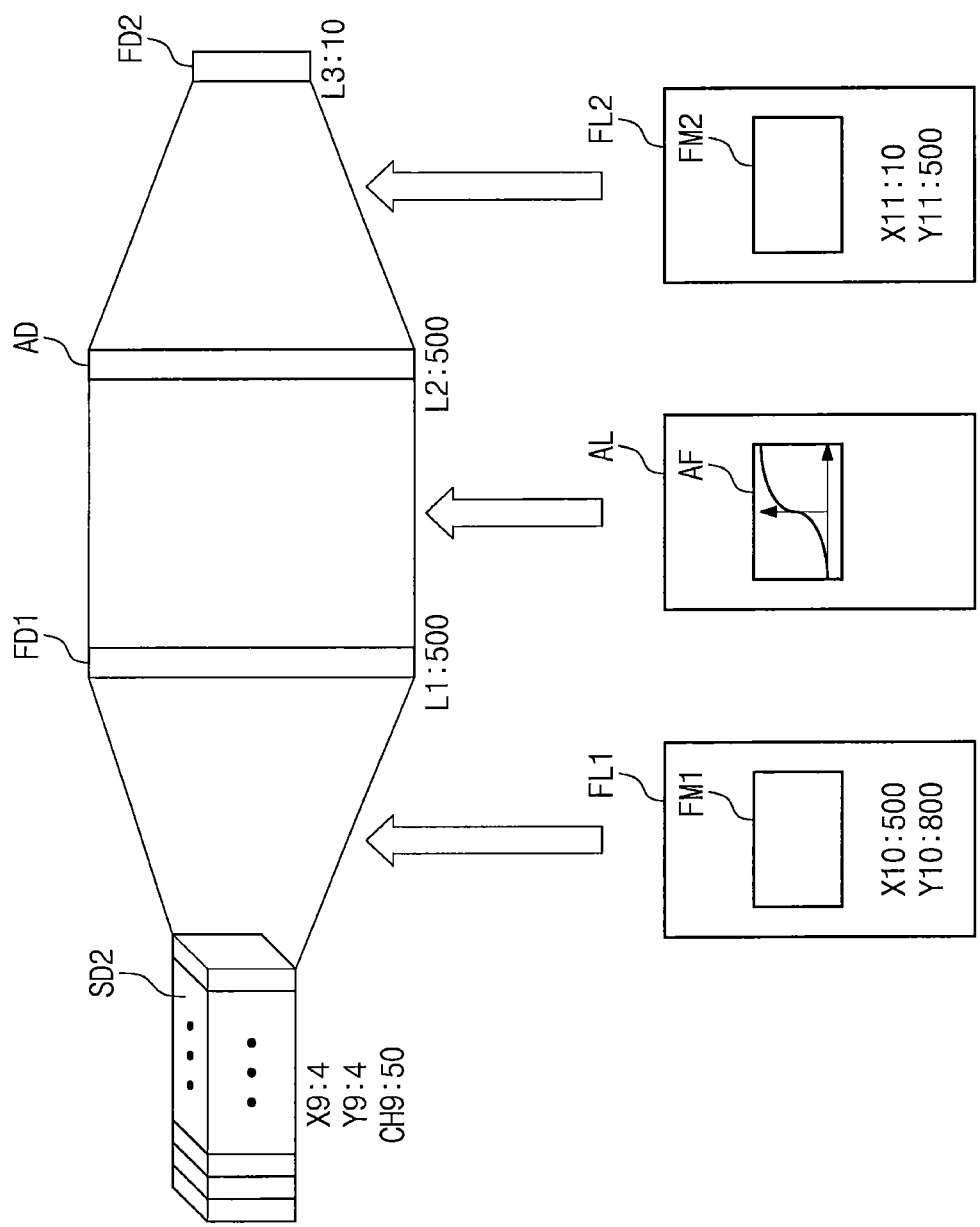
FIG. 5 further illustrates an example in which a feature of one of the images is extracted by a plurality of layers of a convolutional neural network according to some embodiments of the inventive concept.

FIG. 5 further illustrates an example in which a feature of one of the images (e.g., HRI, LRI, RI, and OI) is extracted by a plurality of layers of a convolutional neural network (CNN) according to some embodiments of the inventive concept. Referring to FIGS. 3 to 5, a first fully connected layer FL1 may be applied to the second sub-sampling data SD2. The first fully connected layer FL1 may include a first fully connected kernel FM1. The first fully connected kernel FM1 may be of size 500×800 (800 wide (X10), 800 height (Y10)).

In an embodiment, the size in wide (X10) of the first fully connected kernel FM1 may correspond to the number of sampling data of the second sub-sampling data SD2, and the size in height (Y10) thereof may correspond to the number of sampling data of first fully connected data FD1 being a result to which the first fully connected layer FL1 is applied.

However, the size of the first fully connected kernel FM1 may vary with a fully connected structure, the number of hidden layers, etc. In an embodiment, the first fully connected layer FL1 may further include a bias. For example, the bias may be a value that is added to or subtracted from a result to which the first fully connected kernel FM1 is applied. The bias may include one value or may include values varying with a location.

A length L1 of the first fully connected data FD1 may be "500." The length L1 of the first fully connected data FD1 may indicate the number of sample data. An activation layer AL may be applied to the first fully connected data FD1. The activation layer AL may include an activation kernel AF. The activation kernel AF may restrict values of sample data to values within a given range like a sigmoid function.

A result to which the activation layer AL is applied may be activation data AD. A length L2 of the activation data AD may be the same as the length L1 of the first fully connected data FD1, that is, "500." A second fully connected layer FL2 may be applied to the activation data AD. The second fully connected layer FL2 may include a second fully connected kernel FM2. The second fully connected kernel FM2 may be of size 10×500 (10 wide (X11), 500 height (Y11)).

In an embodiment, the size in wide (X11) of the second fully connected kernel FM2 may correspond to the number of sampling data of the activation data AD, and the size in height (Y11) thereof may correspond to the number of sampling data of second fully connected data FD2 being a result to which the second fully connected layer FL2 is applied. However, the size of the second fully connected kernel FM2 may vary with a fully connected structure, the number of hidden layers, etc.

The second fully connected data FD2 may include information about a feature of the image data IMG. The second fully connected data FD2 may appear in the form of a space vector. The first to fifth feature extractors 111 to 115 may detect a feature of each image by applying the convolutional neural network CNN described with reference to FIGS. 4 and 5 to the low resolution image LRI, the reference image RI, the low resolution image LRI, the high resolution image HRI, and the optical image OI, respectively.

In an embodiment, convolutional neural networks applied to the high resolution image HRI, the low resolution image LRI, the reference image RI, and the optical image OI may be the same as or different from each other. For example, the numbers of layers, kinds of layers, sizes of layers, features (e.g., strides, synapse values, etc.) of layers applied to the high resolution image HRI, the low resolution image LRI, the reference image RI, and the optical image OI may be the same as or different from each other.

In an embodiment, the classifier 117 may be configured to perform defect classification by using the convolutional neural network CNN described with reference to FIGS. 4 and 5. For example, the classifier 117 may combine outputs of the comparator 116 and the third to fifth feature extractors 113 to 115 and may use the combined result as input data replacing the image data IMG of FIG. 4. The classifier 117 may be configured to perform defect classification by using a value of the second fully connected data FD2 of FIG. 5, for example, a space vector.

Figure 6:
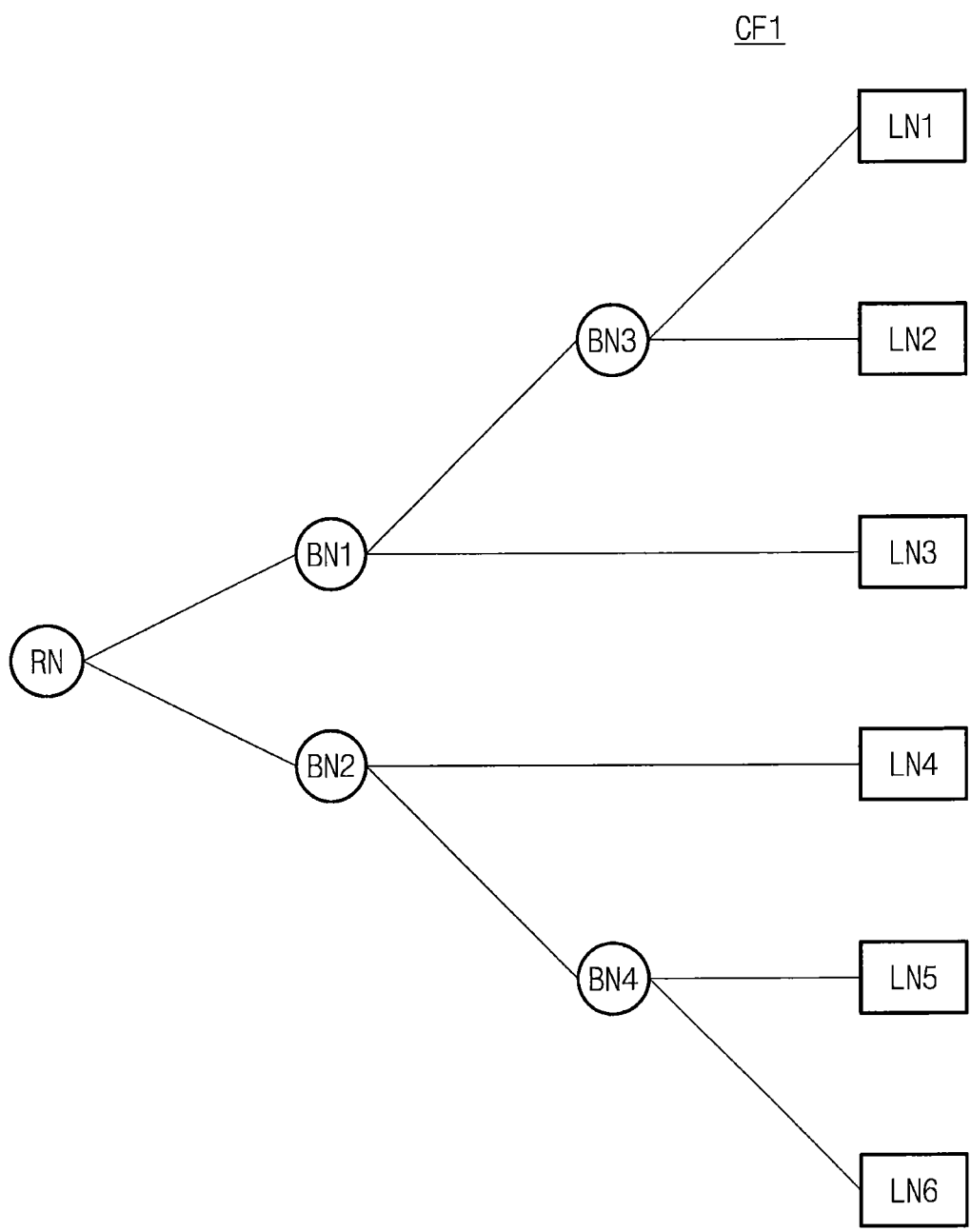
FIG. 6 illustrates an example in which a classifier performs defect classification by using a machine learning-based decision tree according to some embodiments of the inventive concept.

FIG. 6 illustrates an example in which the classifier 117 performs defect classification by using a machine learning-based decision tree according to some embodiments of the inventive concept. Referring to FIGS. 3 and 6, the classifier 117 may execute a classification module CF1. The classification module CF1 includes a root node RN, first to fourth branch nodes BN1 to BN4, and first to sixth leaf nodes LN1 to LN6. The root node RN, the first to fourth branch nodes BN1 to BN4, and the first to sixth leaf nodes LN1 to LN6 may be connected through branches.

In each of the root node RN and the first to fourth branch nodes BN1 to BN4, comparison may be performed with respect to at least one of an output of the comparator 116, outputs of the third to fifth feature extractors 113 to 115, and the first to third meta information MI1 to MI3. One of a plurality of branches connected to each node is selected based on the comparison result. If a next branch node is connected to the selected branch, comparison may be further performed at the next branch node.

If a leaf node is connected to the selected branch, a defect of semiconductor patterns may be classified based on a value of the leaf node. In an embodiment, information having the highest selectivity among the output of the comparator 116, the outputs of the third to fifth feature extractors 113 to 115, and the first to third meta information MI1 to MI3 may be compared at the root node RN.

Figure 7:
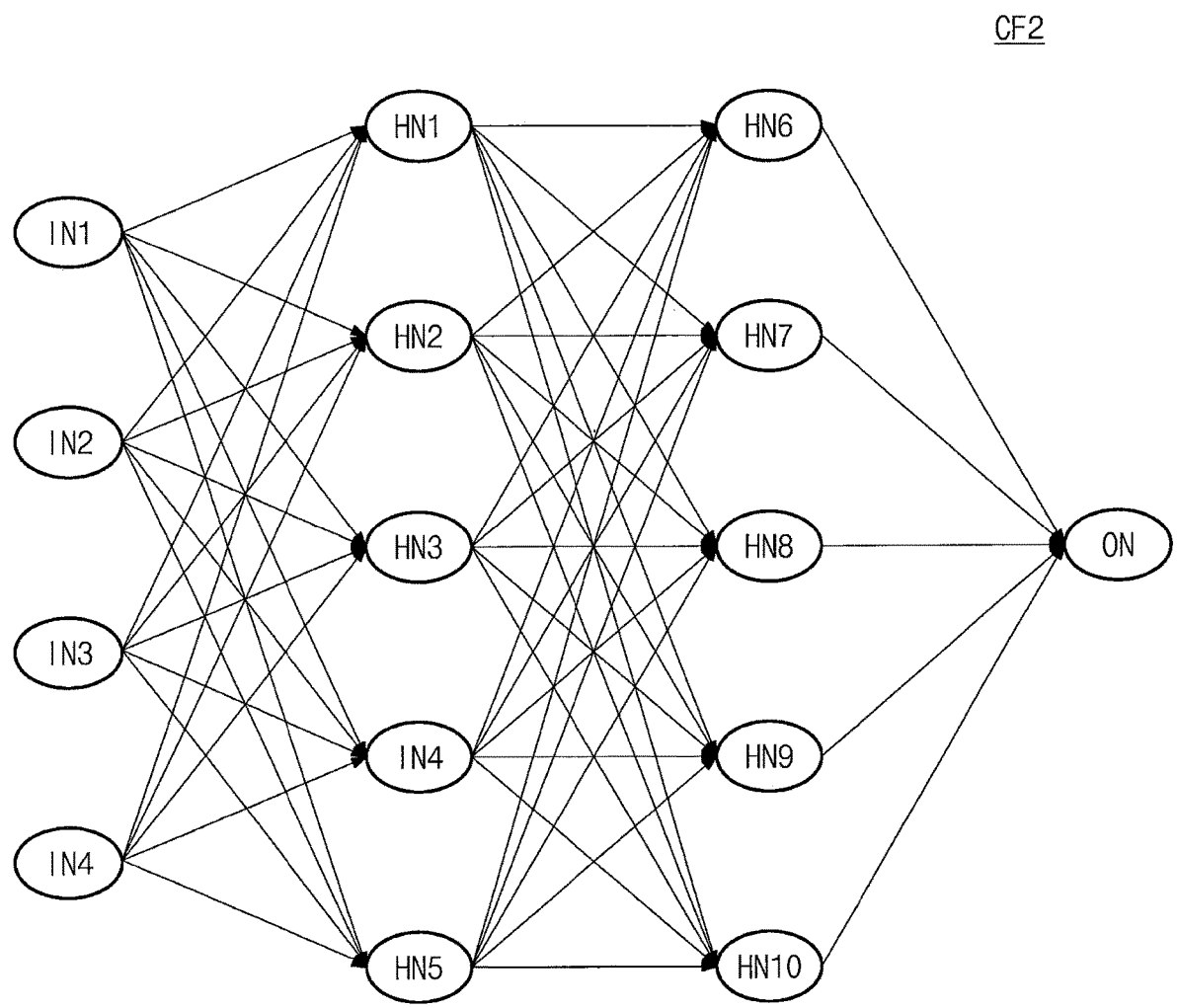
FIG. 7 illustrates an example in which a classifier performs defect classification by using a machine learning-based neural network according to some embodiments of the inventive concept.

FIG. 7 illustrates an example in which the classifier 117 performs defect classification by using a machine learning-based neural network according to some embodiments of the inventive concept. Referring to FIGS. 3 and 7, the classifier 117 may execute a classification module CF2.

The classification module CF2 includes first to fourth input nodes IN1 to IN4, first to tenth hidden nodes HN1 to HN10, and an output node ON. The number of input nodes, the number of hidden nodes, and the number of output nodes may be determined in advance upon constructing the neural network.

The first to fourth input nodes IN1 to IN4 form an input layer. The first to fifth hidden nodes HN1 to HN5 form a first hidden layer. The sixth to tenth hidden nodes HN6 to HN10 form a second hidden layer. The output node ON forms an output layer. The number of hidden layers may be determined in advance upon constructing the neural network.

An output of the comparator 116, outputs of the third to fifth feature extractors 113 to 115, and the first to third meta information MI1 to MI3 may be input to the first to fourth input nodes IN1 to IN4. Features or meta information of different kinds may be input to different input nodes. The information of each input node is transferred to the first to fifth hidden nodes HN1 to HN5 of the first hidden layer, with weights applied to the information thereof.

An input of each of the first to fifth hidden nodes HN1 to HN5 is transferred to the sixth to tenth hidden nodes HN6 to HN10 of the second hidden layer, with weights applied to the input thereof. Inputs of the sixth to tenth hidden nodes HN6 to HN10 are transferred to the output node ON, with weights applied to the inputs thereof. Information of the output node ON may be output as the classification result CR.

Figure 8:
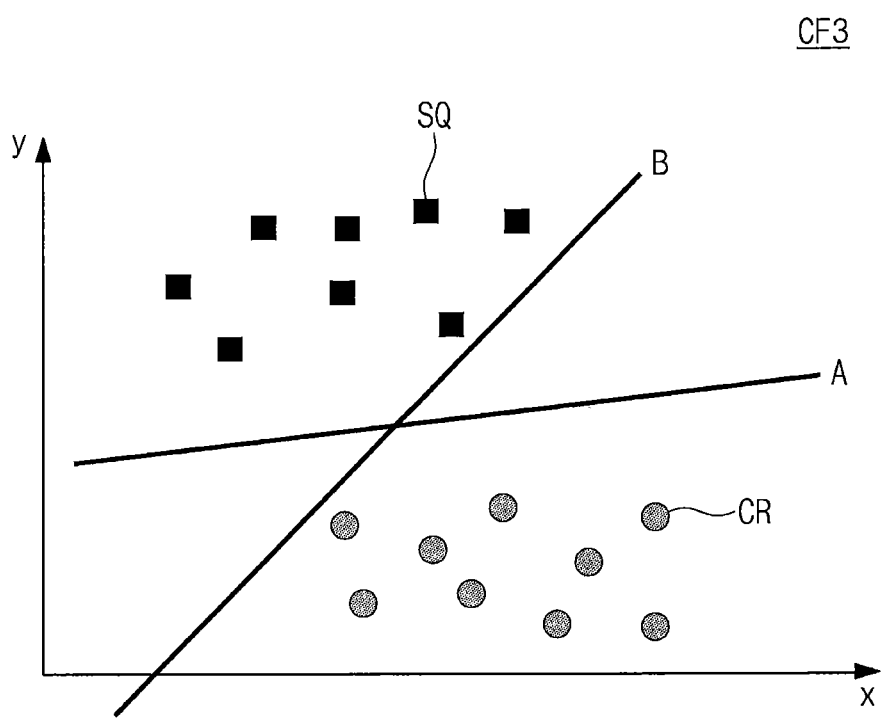
FIG. 8 illustrates an example in which a classifier performs defect classification by using a machine learning-based support vector machine according to some embodiments of the inventive concept.

FIG. 8 illustrates an example in which the classifier 117 performs defect classification by using a machine learning-based support vector machine (SVM) according to some embodiments of the inventive concept. Referring to FIGS. 3 and 8, the classifier 117 may be configured to execute a classification module CF3.

The classification module CF3 may be a support vector machine. In FIG. 8, coordinate axes including a horizontal axis "x" and a vertical axis "y" represent an output of the comparator 116, outputs of the third to fifth feature extractors 113 to 115, and the first to third meta information MI1 to MI3.

Shapes (square and circle) of samples distributed in FIG. 8 indicate different classification results SQ and CR. The classification module CF3 may be configured to determine the classification results SQ and CR, based on whether the output of the comparator 116, the outputs of the third to fifth feature extractors 113 to 115, and the first to third meta information MI1 to MI3 are included in any area.

Figure 9:
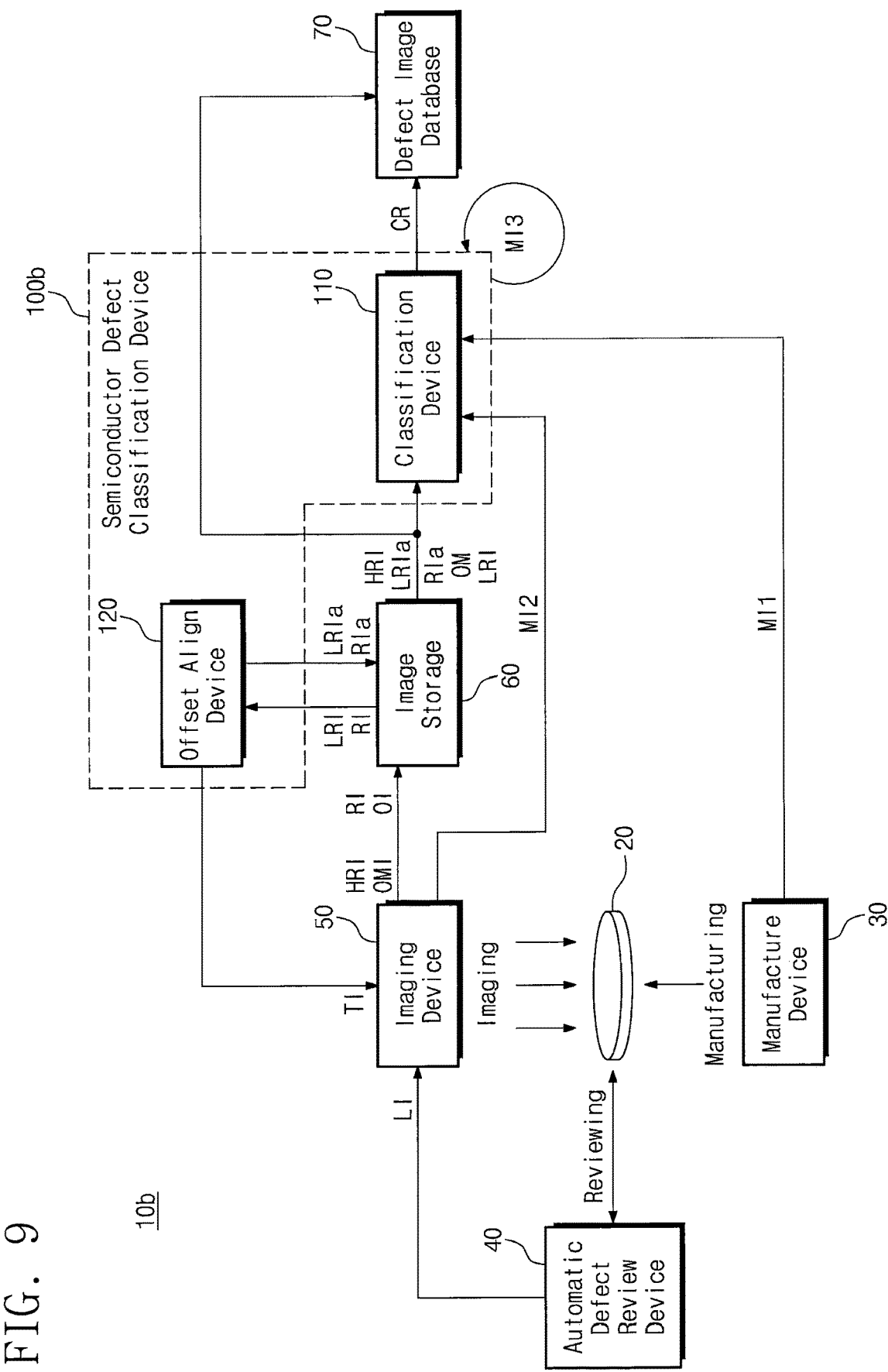
FIG. 9 is a block diagram illustrating a semiconductor defect classification system according to second embodiments of the inventive concept.

FIG. 9 is a block diagram illustrating a semiconductor defect classification system 10b according to further embodiments of the inventive concept. Referring to FIG. 9, the semiconductor defect classification system 10b includes the wafer 20, the manufacture device 30, the automatic defect review device 40, the imaging device 50, the image storage 60, the defect image database 70, and a semiconductor defect classification device 100b.

Compared with the semiconductor defect classification device 100a of FIG. 1, the semiconductor defect classification device 100b further includes an offset align device 120. The offset align device 120 may be configured to receive the low resolution image LRI and the reference image RI from the image storage 60. The offset align device 120 may be configured to detect (or classify) an offset based on the machine learning from the low resolution image LRI and the reference image RI.

The offset may indicate a difference between the low resolution image LRI and the reference image RI. For example, the difference between the low resolution image LRI and the reference image RI, that is, the offset, may occur due to an error of parameter values, such as a capturing distance, a capturing angle, and/or a capturing location of the imaging device 50.

The offset align device 120 may be configured to align the low resolution image LRI and the reference image RI based on the detected offset and may generate an aligned low resolution image LRIa and an aligned reference image RIa. The offset align device 120 may be configured to store the aligned low resolution image LRIa and the aligned reference image RIa in the image storage 60.

The offset align device 120 may be configured to generate tuning information TI based on the detected offset and may provide the tuning information TI to the imaging device 50. For example, the tuning information TI may indicate a parameter value of the imaging device 50, which may be adjusted to align the low resolution image LRI and the reference image RI. The parameter value may include a capturing distance, a capturing angle, a capturing location, etc.

The imaging device 50 may be configured to apply the tuning information TI to imaging a next wafer. For example, the imaging device 50 may be configured to adjust parameter values, such as a capturing distance, a capturing angle, and a capturing location, based on the tuning information TI upon imaging a next wafer.

The classification device 110 of the semiconductor defect classification device 100b may receive the high resolution image HRI, the aligned low resolution image LRIa, the aligned reference image RIa, the optical image OI, and the low resolution image LRI from the image storage 60. The classification device 110 may be configured to perform machine learning-based defect classification on the detected images.

Figure 10:
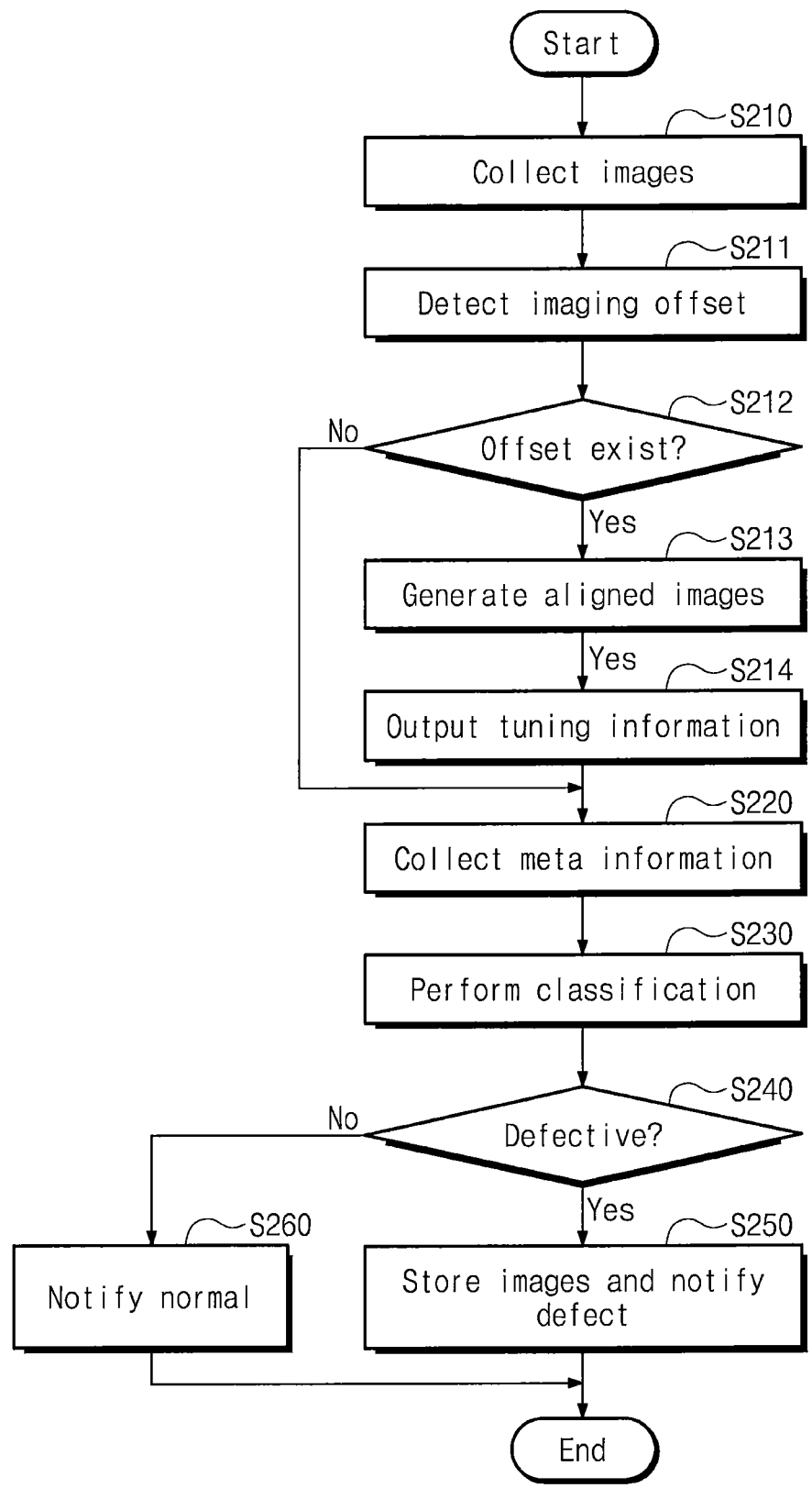
FIG. 10 is a flowchart illustrating operating methods of a semiconductor defect classification device of FIG. 9 according to some embodiments of the inventive concept.

FIG. 10 is a flowchart illustrating operations of the semiconductor defect classification device 100b of FIG. 9 according to some embodiments of the inventive concept. Referring to FIGS. 9 and 10, at block S210, the semiconductor defect classification device 100b may collect images, for example, the high resolution image HRI, the low resolution image LRI, the reference image RI, and the optical image OI.

At block S211, the offset align device 120 of the semiconductor defect classification device 100b may detect an imaging offset. For example, the offset align device 120 may detect an offset based on the machine learning from the low resolution image LRI and the reference image RI.

At block S212, the offset align device 120 determines whether an offset exists. If the offset does not exist, the low resolution image LRI and the reference image RI may be used without alignment. If the offset exists, operations continue at block S213 where the offset align device 120 may generate the aligned low resolution image LRIa and the aligned reference image RIa. At block S214, the offset align device 120 may generate and output the tuning information TI based on the offset.

At block S220, the classification device 110 may collect the first to third meta information MI1 to MI3. At block S230, the classification device 110 may perform classification. For example, when the offset does not exist, the classification device 110 may perform classification based on the high resolution image HRI, the low resolution image LRI, the reference image RI, the optical image OI, and the first to third meta information MI1 to MI3.

When the offset exists, the classification device 110 may perform classification based on the aligned low resolution image LRIa, the aligned reference image RIa, the high resolution image HRI, the low resolution image LRI, the optical image OI, and the first to third meta information MI1 to MI3.

Block S240 to block S260 may correspond to block S140 to block S160. Accordingly, a description of the operations associated with blocks S140 to S160 will not be repeated.

According to the above-described embodiments, the semiconductor defect classification device 100b may be configured to detect whether an offset is present between the low resolution image LRI and the reference image RI and may perform defect classification by applying the offset. Accordingly, the reliability of the classification result CR may be improved.

Also, the semiconductor defect classification device 100b may be configured to generate the tuning information TI based on the offset. The imaging device 50 may revise (or change) an imaging parameter by using the tuning information TI. Accordingly, the imaging offset of the imaging device 50 may be dynamically (or adaptively) corrected, and, thus, the reliability of the classification result CR may be further improved.

Figure 11:
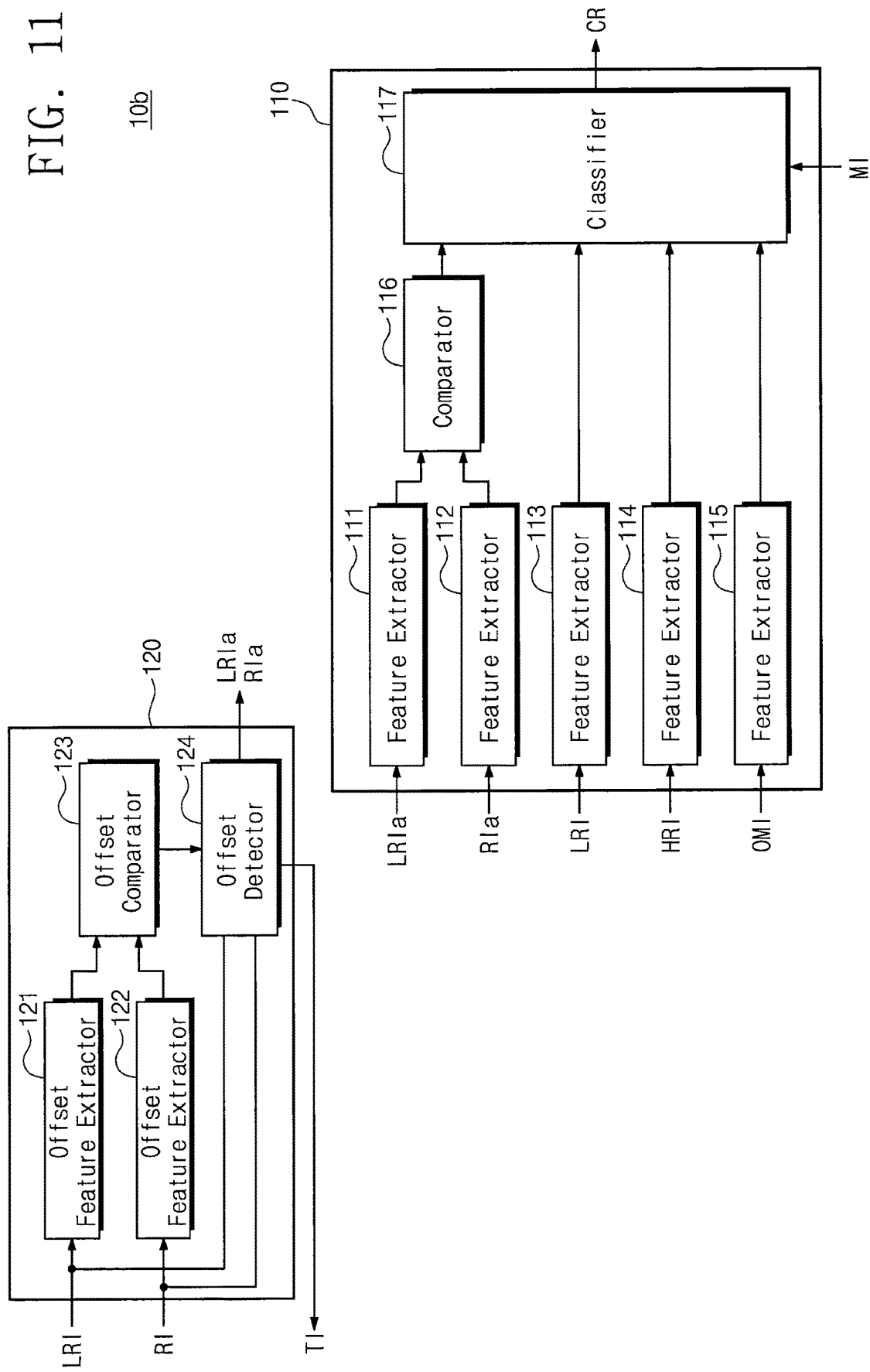
FIG. 11 is a block diagram illustrating a semiconductor defect classification device including a classification device and an offset align device according to some embodiments of the inventive concept.

FIG. 11 is a block diagram illustrating the semiconductor defect classification device 100*b* including the classification device 110 and the offset align device 120 according to some embodiments of the inventive concept. Referring to FIGS. 9 and 11, the classification device 110 includes the first to fifth feature extractors 111 to 115, the comparator 116, and the classifier 117.

The aligned low resolution image LRIa may be transferred to the first feature extractor 111 from the image storage 60 when an offset exists, and the low resolution image LRI may be transferred to the first feature extractor 111 from the image storage 60 when no offset exists.

The aligned reference image RIa may be transferred to the second feature extractor 112 from the image storage 60 when an offset exists, and the reference image RI may be transferred to the second feature extractor 112 from the image storage 60 when no offset exists.

Except for inputs of the first and second feature extractors 111 and 112, the classification device 110 may have the same or similar structure as described with reference to FIG. 3 and may operate in the same or similar manner as described with reference to FIG. 3, and, thus, a description thereof will not be repeated.

The offset align device 120 includes first and second offset feature extractors 121 and 122, an offset comparator 123, and an offset detector 124. The first offset feature extractor 121 may receive the low resolution image LRI from the image storage 60.

The first offset feature extractor 121 may extract a feature of the low resolution image LRI from the low resolution image LRI. For example, as described with reference to FIGS. 4 and 5, the first offset feature extractor 121 may extract a feature of the low resolution image LRI by using the machine learning-based convolutional neural network (CNN) according to some embodiments of the inventive concept.

The second offset feature extractor 122 may receive the reference image RI from the image storage 60. The second offset feature extractor 122 may extract a feature of the reference image RI. For example, as described with reference to FIGS. 4 and 5, the second offset feature extractor 122 may extract a feature of the reference image RI by using the machine learning-based convolutional neural network (CNN) according to some embodiments of the inventive concept.

As described with reference to FIGS. 4 and 5, the first and second offset feature extractors 121 and 122 may have the same or similar characteristic and may use the same or similar parameters. In other example embodiments, the first and second offset feature extractors 121 and 122 may have different characteristics or different parameters.

The offset comparator 123 is configured to compare features output from the first and second offset feature extractors 121 and 122 and may detect a difference between the features. The offset comparator 123 may be configured to transfer the detected difference to the offset detector 124. For example, the detected difference may be expressed in the form of values on spatial coordinates.

The offset detector 124 may be configured to detect an offset based on the difference transferred from the offset comparator 123. For example, the offset detector 124 may detect an offset by using one or more techniques, such as, but not limited to, a machine learning-based algorithms, such as the convolutional neural network (CNN) described with reference to FIGS. 4 and 5, a decision tree, such as the decision tree described with reference to FIG. 6, a neural network, such as the neural network described with reference to FIG. 7, and a support vector machine (SVM), such as the SVM described with reference to FIG. 8.

The offset detector 124 may be configured to generate the aligned low resolution image LRIa and the aligned reference image RIa by using the detected offset. The offset detector 124 may be configured to store the aligned low resolution image LRIa and the aligned reference image RIa in the image storage 60.

The offset detector 124 may be configured to generate the tuning information TI by using the detected offset. The offset detector 124 may be configured to provide the tuning information TI to the imaging device 50. In other embodiments, the offset detector 124 may be configured to store the tuning information TI in a storage medium that the imaging device 50 is able to access.

Figure 12:
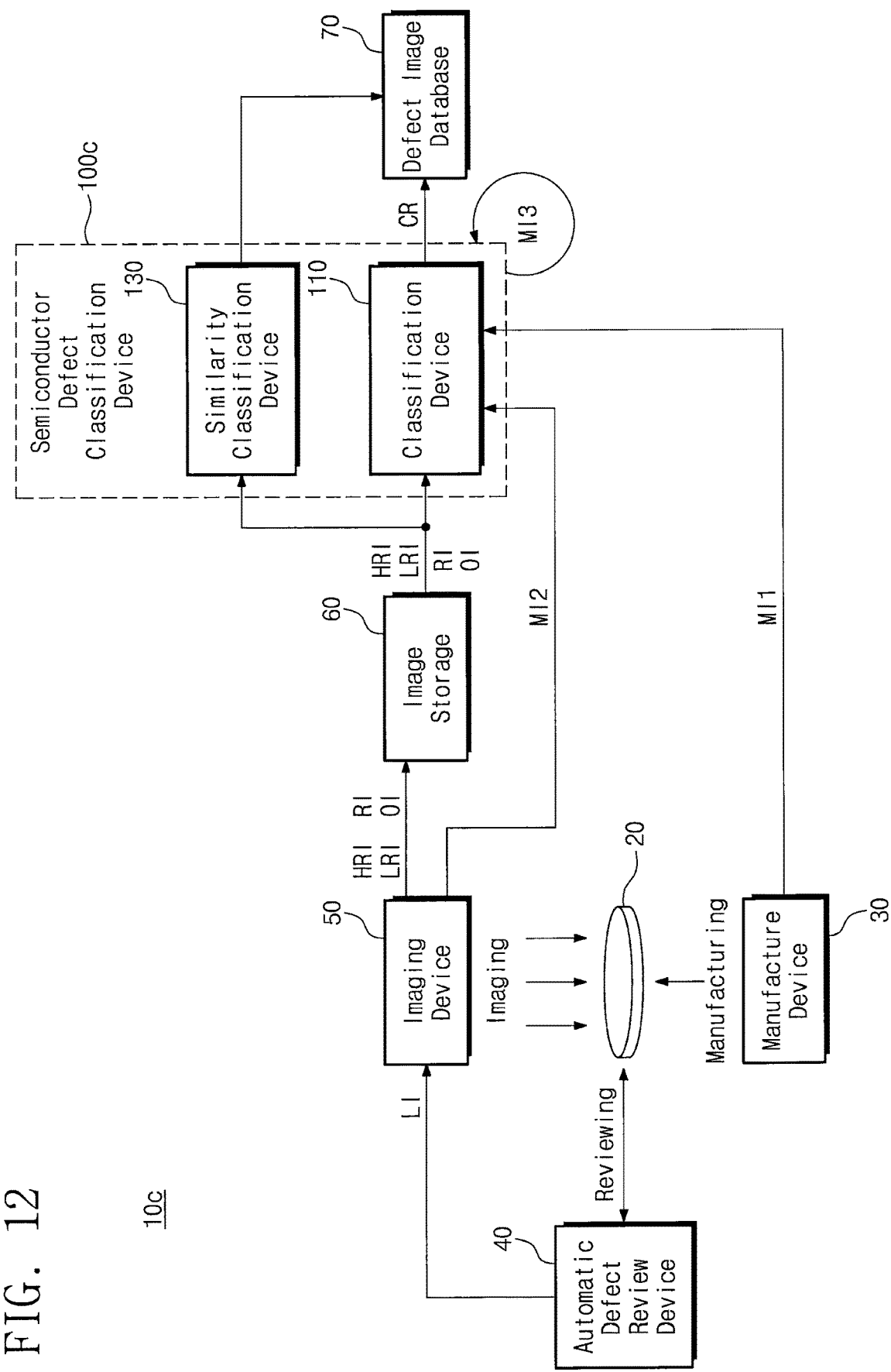
FIG. 12 is a block diagram illustrating a semiconductor defect classification system according to third embodiments of the inventive concept.

FIG. 12 is a block diagram illustrating a semiconductor defect classification system 10*c* according to further embodiments of the inventive concept. Referring to FIG. 12, the semiconductor defect classification system 10*c* includes the wafer 20, the manufacture device 30, the automatic defect review device 40, the imaging device 50, the image storage 60, the defect image database 70, and a semiconductor defect classification device 100*c*.

Compared with the semiconductor defect classification device 100*a* of FIG. 1, the semiconductor defect classification device 100*c* further includes a similarity classification device 130. The similarity classification device 130 may be configured to perform machine learning-based similarity classification on at least one of the high resolution image HRI, the low resolution image LRI, the reference image RI, and the optical image OI or a combination of at least two or more thereof.

For example, as described with reference to FIGS. 4 and 5, the similarity classification device 130 may be configured to perform similarity classification based on the convolutional neural network (CNN). In other embodiments, as described with reference to FIGS. 6 to 8, the similarity classification device 130 may be configured to perform similarity classification by using one or more machine learning-based algorithms, such as, but not limited to a decision tree, a neural network, and a support vector machine (SVM).

In an embodiment, the similarity may indicate similarity between images (e.g., HRI, LRI, RI, or OI) currently captured by the imaging device 50 and images stored in the defect image database 70. In other embodiments, the similarity may indicate similarity between images (e.g., HRI, LRI, RI, or OI) currently captured and images used for machine learning of the classification device 110.

If semiconductor patterns associated with the images HRI, LRI, RI, and OI have a defect and the similarity is lower than a threshold value, the similarity classification device 130 may be configured to allow the images HRI, LRI, RI, and IO to be stored in the defect image database 70. If semiconductor patterns associated with the images HRI, LRI, RI, and OI do not have a defect or the similarity is not lower than the threshold value, the similarity classification device 130 may be configured to allow the images HRI, LRI, RI, and IO not to be stored in the defect image database 70.

That is, as the similarity classification device 130 is added to the semiconductor defect classification device 100*c*, images that are associated with semiconductor patterns having a defect and are not similar to images previously stored or applied to the machine learning are stored in the defect image database 70.

That is, images that are helpful to improve the performance of a classification algorithm upon performing the machine learning are stored in the defect image database 70. Accordingly, a storage capacity of the defect image database 70 may be used more efficiently.

Figure 13:
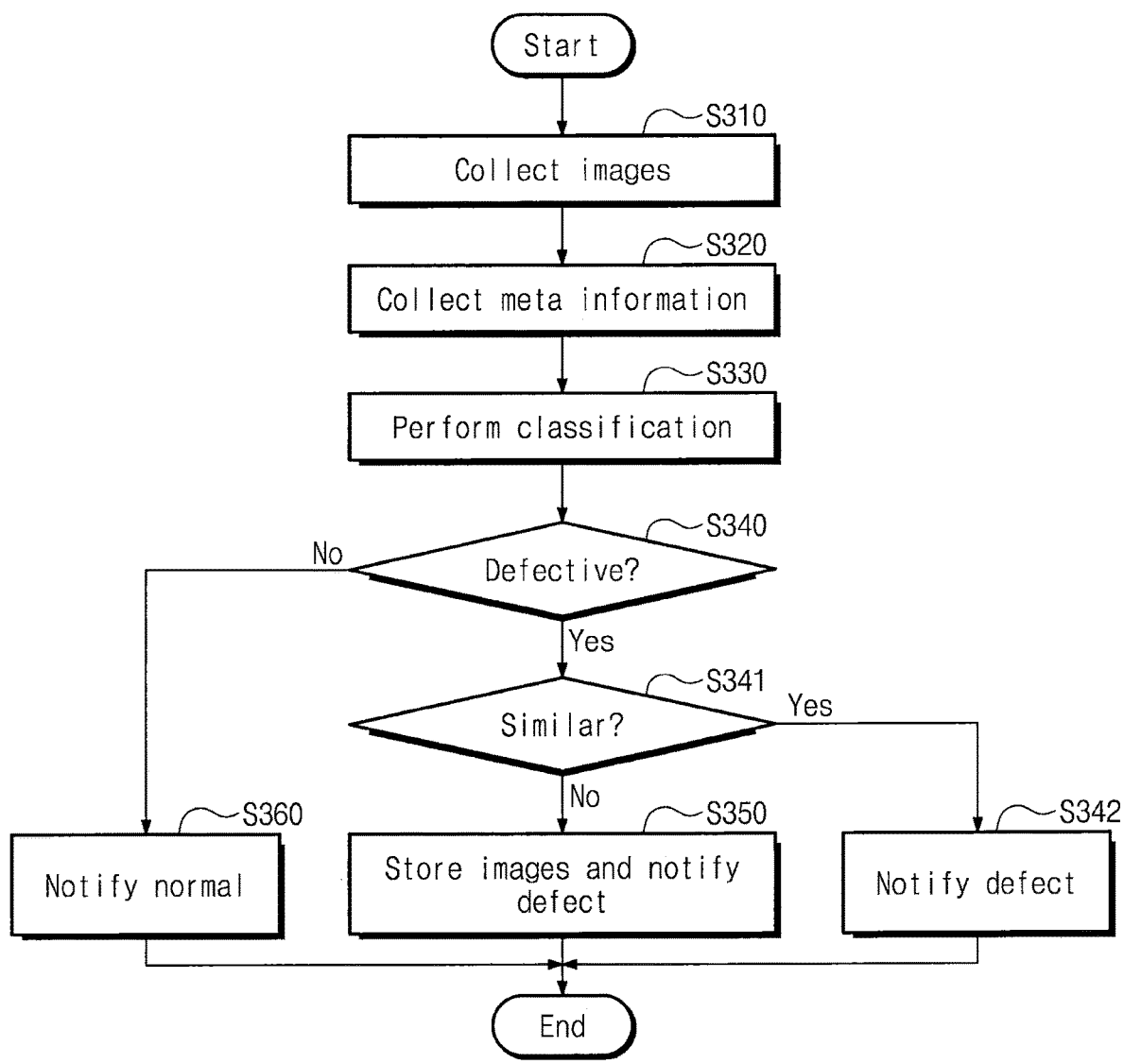
FIG. 13 is a flowchart illustrating operating methods of a semiconductor defect classification device of FIG. 12 according to some embodiments of the inventive concept.

FIG. 13 is a flowchart illustrating operations of the semiconductor defect classification device 100c of FIG. 12 according to some embodiments of the inventive concept. Referring to FIGS. 12 and 13, at block S310, the semiconductor defect classification device 100c may collect the high resolution image URI, the low resolution image LRI, the reference image RI, and the optical image OI.

At block S320, the classification device 110 may collect the first to third meta information MI1 to MI3. At block S330, the classification device 110 may perform classification. At block S340, the classification device 110 may determine whether a defect exists. Block S310 to block S340 may be the same as or similar to block S110 to block S140, and, thus, a description thereof will not be repeated.

If it is determined at block S340 that a defect is present in the semiconductor patterns, then operations continue at block S341. At block S341, the similarity classification device 130 may perform similarity classification and may determine whether the similarity is not lower than a threshold value. If the similarity is not lower than the threshold value, then the semiconductor defect classification device 100c may notify the classification result CR indicating a defect without storing the images HRI, LRI, RI, and OI in the defect image database 70 at block S342.

If the similarity is lower than the threshold value, then the semiconductor defect classification device 100c may store the images HRI, LRI, RI, and OI in the defect image database 70 and may notify the classification result CR indicating a defect at block S350.

If it is determined in operation S340 that a defect is absent from semiconductor patterns, then operations continue at block S360. At block S360, the semiconductor defect classification device 100c may notify the classification result CR indicating a normal state.

Embodiments have been described above with respect to determining similarity when semiconductor patterns have a defect and the images HRI, LRI, RI, and OI are selectively stored in the defect image database 70 based on the determination result. However, even when semiconductor patterns do not have a defect, as described with reference to block S360, the similarity may be determined, and the images HRI, LRI, RI, and OI may be stored in the defect image database 70 based on the determination result.

For example, images that have low similarity with images used for previous learning or previously stored in the defect image database 70 may nevertheless be helpful for machine learning in the future. Accordingly, even when semiconductor patterns do not have a defect, if the images URI, LRI, RI, and OI of the semiconductor patterns have low similarity with previously trained images or images stored in the defect image database 70, the images HRI, LRI, RI, and OI may be stored in the defect image database 70.

Figure 14:
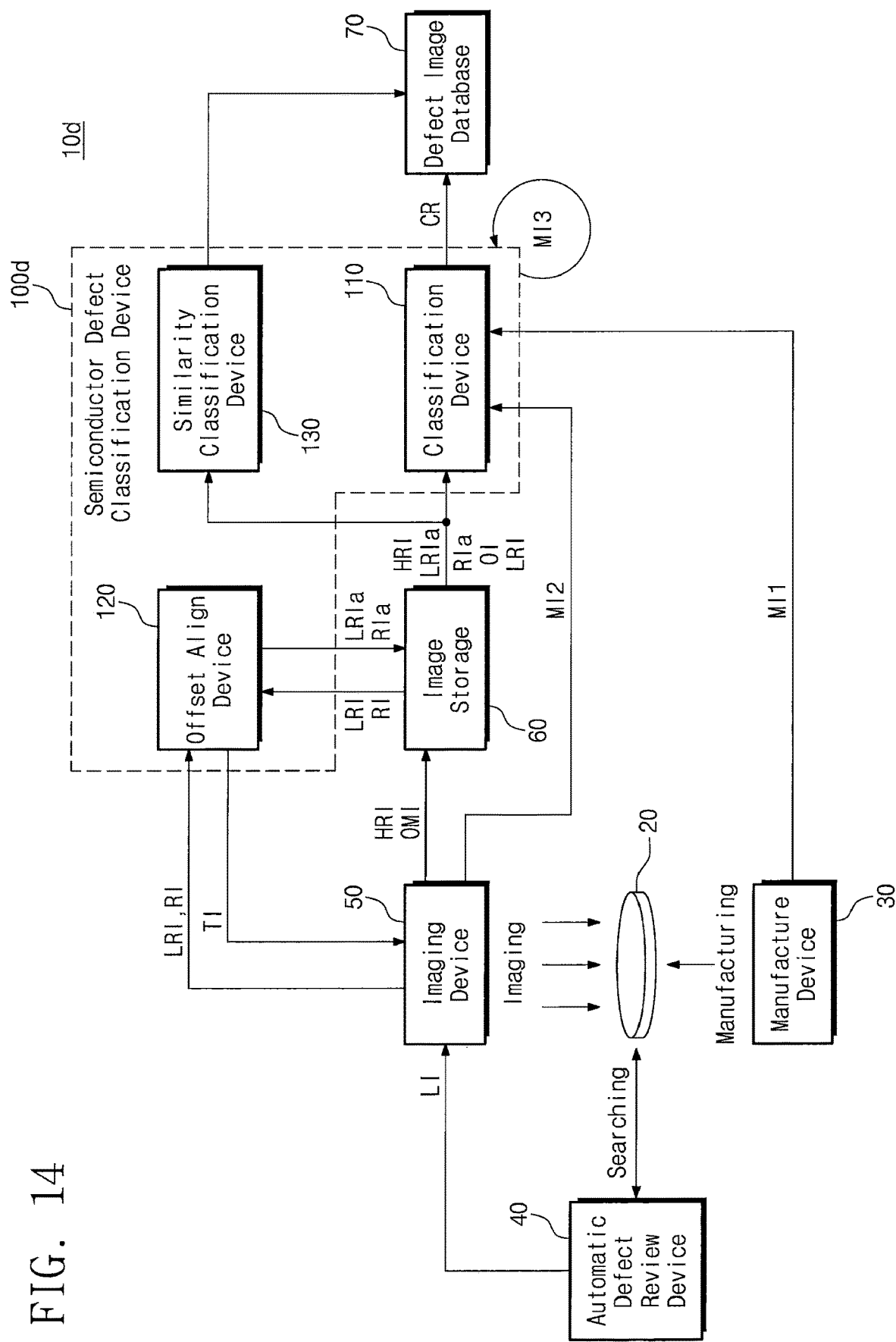
FIG. 14 is a block diagram illustrating a semiconductor defect classification system according to fourth embodiments of the inventive concept.

FIG. 14 is a block diagram illustrating a semiconductor defect classification system 10d according to further embodiments of the inventive concept. Referring to FIG. 14, the semiconductor defect classification system 10d includes the wafer 20, the manufacture device 30, the automatic defect review device 40, the imaging device 50, the image storage 60, the defect image database 70, and a semiconductor defect classification device 100d.

The semiconductor defect classification device 100d may include the offset align device 120 as described with reference to FIG. 9. The semiconductor defect classification device 100d may further include the similarity classification device 130 as described with reference to FIG. 12.

That is, the semiconductor defect classification device 100d may be configured to detect an offset between the low resolution image LRI and the reference image RI and may be configured to generate the aligned low resolution image LRIa and the aligned reference image RIa. The aligned low resolution image LRIa and the aligned reference image RIa may be applied to the classification device 110 for classification.

Also, the semiconductor defect classification device 100d may be configured to classify the similarity between the images HRI, LRI, RI, and OI and previous images and may determine whether to store the images HRI, LRI, RI, and OI in the defect image database 70 based on the similarity.

Figure 15:
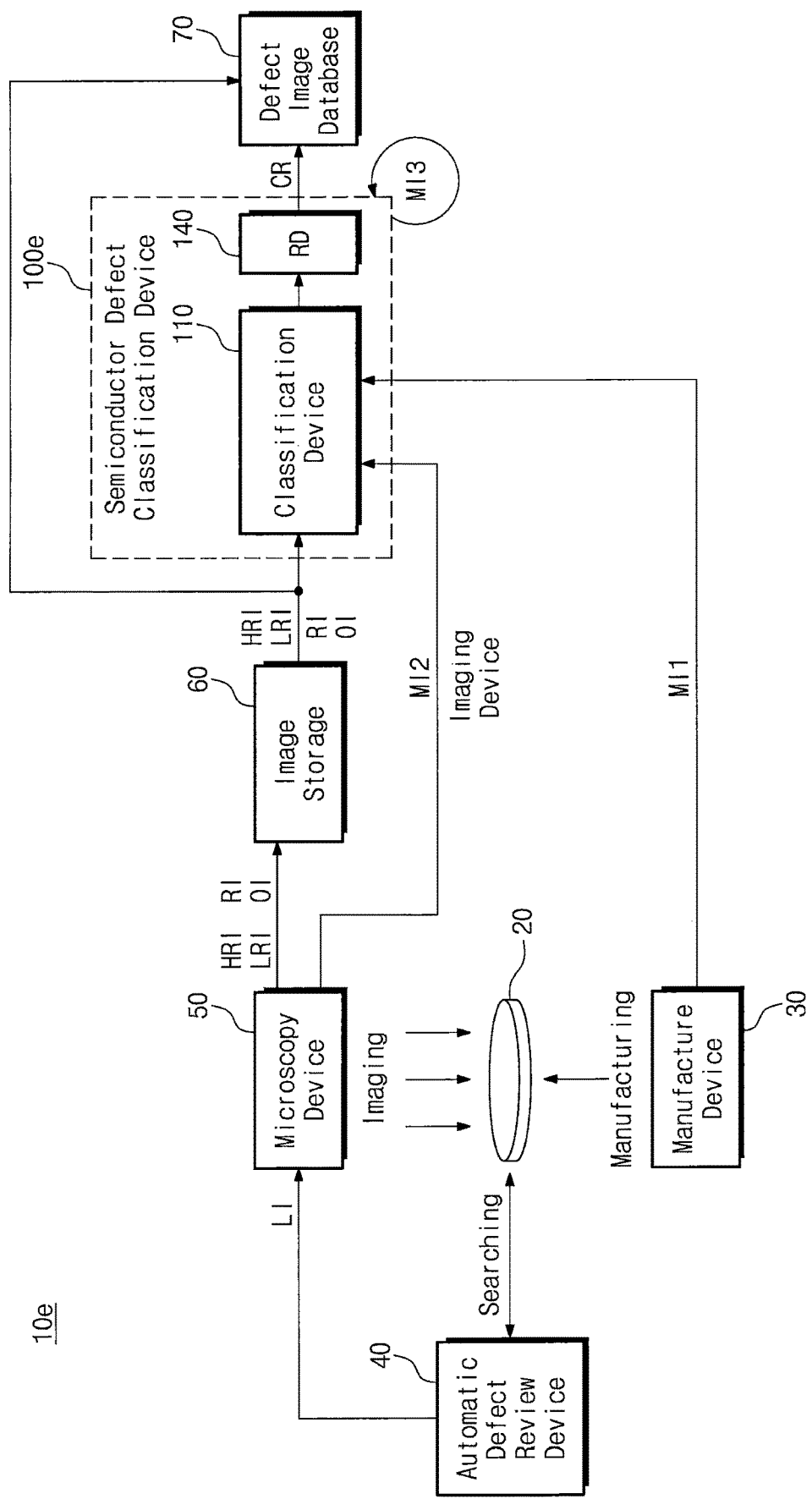
FIG. 15 is a block diagram illustrating a semiconductor defect classification system according to fifth embodiments of the inventive concept.

FIG. 15 is a block diagram illustrating a semiconductor defect classification system 10e according to further embodiments of the inventive concept. Referring to FIG. 15, the semiconductor defect classification system 10e includes the wafer 20, the manufacture device 30, the automatic defect review device 40, the imaging device 50, the image storage 60, the defect image database 70, and a semiconductor defect classification device 100e.

Compared with the semiconductor defect classification device 100a of FIG. 1, the semiconductor defect classification device 100e further includes a rejection device 140. The rejection device 140 may be configured to verify an output of the classification device 110. For example, the rejection device 140 may be configured to classify the reliability of the output of the classification device 110.

For example, the rejection device 140 may be configured to verify the reliability by using one or more machine learning-based algorithms such as, for example, the convolutional neural network (CNN) described with reference to FIGS. 4 and 5, the decision tree described with reference to FIG. 6, a neural network described with reference to FIG. 7, and a support vector machine (SVM) described with reference to FIG. 8.

If the reliability is not lower than a threshold value or if the reliability is classified as being reliable, the rejection device 140 may be configured to output the output of the classification device 110 as the classification result CR. If the reliability is not greater than a threshold value or if the reliability is classified as being not reliable, the rejection device 140 may be configured to output the classification result CR indicating that the reliability is low.

If the classification result CR indicating that the reliability is low is output, then the high resolution image HRI, the low resolution image LRI, the reference image RI, and the optical image OI may not be stored in the defect image database 70.

In an embodiment, the rejection device 140 may be provided in the semiconductor defect classification device 100b described with reference to FIG. 9, the semiconductor defect classification device 100c described with reference to FIG. 12, and/or the semiconductor defect classification device 100d described with reference to FIG. 14.

According to embodiments of the inventive concept, a semiconductor defect is automatically detected based on machine learning. Accordingly, a semiconductor defect classification device, a semiconductor defect classification method, and a semiconductor defect classification system, which may consistently detect the semiconductor defect with improved accuracy and reliability, are provided.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A semiconductor defect classification device comprising:
    feature extractors configured to receive images of semiconductor patterns on a wafer, the images comprising a low resolution image, a high resolution image, a reference image, and an optical image of the semiconductor patterns, and to extract features of the images from the images;
    a comparator configured to compare a feature of the low resolution image and a feature of the reference image and to generate a result of the comparison; and
    a classifier configured to receive the features of the images, first meta information about the wafer, and the result of the comparison and to use machine learning to classify a defect of the semiconductor patterns associated with the images based on the features of the images, which include the feature of the low resolution image, a feature of the high resolution image, and a feature of the optical image, the result of the comparison, and the first meta information.

2. The semiconductor defect classification device of claim 1, wherein the feature extractors are configured to extract the features of the images by using a stacked convolutional neural network (CNN).

3. The semiconductor defect classification device of claim 1, wherein the classifier is further configured to classify the defect of the semiconductor patterns by using one of a decision tree, a neural network, and a support vector machine.

4. The semiconductor defect classification device of claim 1, wherein the first meta information comprises at least one of information about a type of a manufacture device processing the wafer, information about a type of a semiconductor device that is manufactured by processing the wafer, information about a type of a process used by the manufacture device to process the wafer, and information about a process operation that the manufacture device performs with respect to the wafer.

5. The semiconductor defect classification device of claim 1, wherein the classifier is further configured to receive second meta information associated with an imaging device used for taking the images of the semiconductor patterns; and
    wherein the classifier is further configured to use the second meta information to classify the defect.

6. The semiconductor defect classification device of claim 5, wherein the second meta information comprises at least one of information about a type of the imaging device used for taking the images of the semiconductor patterns, information about positioning of the imaging device for taking the images, and information about location of the semiconductor patterns on the wafer;
    wherein the information about positioning of the imaging device comprises distance information, location information, and/or angle information associated with the imaging device.

7. The semiconductor defect classification device of claim 1, wherein the classifier is further configured to use third meta information associated with the machine learning to classify the defect.

8. The semiconductor defect classification device of claim 7, wherein the third meta information comprises information about a creator that generates learning data used by the classifier as part of the machine learning.

9. The semiconductor defect classification device of claim 1,
    wherein the semiconductor defect classification device further comprises:
    an offset align device configured to compare the feature of the low resolution image and the feature of the reference image to detect an offset between the feature of the low resolution image and the feature of the reference image and to generate an aligned low resolution image and an aligned reference image by using the offset.

10. The semiconductor defect classification device of claim 9,
    wherein the classifier is further configured to classify the defect of the semiconductor patterns based on the aligned low resolution image and the aligned reference image.

11. The semiconductor defect classification device of claim 1, further comprising:
    a similarity classification device configured to compare the images and previous images stored in a database and to classify a similarity of the images and the previous images stored in the database,
    wherein, the images are stored in the database as a part of the previous images when the similarity is lower than a threshold value.

12. The semiconductor defect classification device of claim 11, wherein at least one of the feature extractors and the classifier perform additional machine learning based on the previous images stored in the database when a learning condition is satisfied.

13. The semiconductor defect classification device of claim 1, further comprising:
    a rejection device configured to receive a result of a classification of the defect by the classifier, to determine a reliability of the result of the classification, and to provide notification that the reliability of the result of the classification is low when the reliability of the result of the classifications lower than a threshold value.

14. A method of classifying a semiconductor defect, the method comprising:
    receiving images of semiconductor patterns on a wafer, the images comprising a low resolution image and a reference image of the semiconductor patterns;
    extracting features of the images from the images;
    receiving meta information associated with the images; and
    using machine learning to classify a defect of the semiconductor patterns based on the features and the meta information;
    wherein the extracting of the features of the images comprises:
    extracting a first feature of the low resolution image and a second feature of the reference image, respectively;
    comparing the first feature and the second feature to detect an offset between the low resolution image and the reference image;
    generating an aligned low resolution image and an aligned reference image from the low resolution image and the reference image based on the offset; and
    comparing the aligned low resolution image and the aligned reference image to extract a comparison feature.

15. A semiconductor defect classification system comprising:

a manufacture device configured to generate semiconductor patterns in a wafer;

an imaging device configured to generate images of the semiconductor patterns, the images comprising a low resolution image, a high resolution image, a reference image, and an optical image of the semiconductor patterns;

a semiconductor defect classification device configured to perform defect classification on the images generated by the imaging device;

wherein the semiconductor defect classification device comprises:

feature extractors configured to receive the images of semiconductor patterns and to extract features of the images from the images, the images comprising a low resolution image and a reference image of the semiconductor patterns;

an offset align device configured to compare a feature of the low resolution image and a feature of the reference image to detect an offset between the feature of the low resolution image and the feature of the reference image and to generate an aligned low resolution image and an aligned reference image by using the offset; and a classifier configured to receive the features of the images and first meta information about the wafer and to use machine learning to classify a defect of the semiconductor patterns associated with the images based on the aligned low resolution image, the aligned reference image, and the first meta information.

16. The semiconductor defect classification system of claim 15, wherein the manufacture device is further configured to output the first meta information associated with the semiconductor patterns, wherein the imaging device is further configured to output second meta information associated with the imaging device, and wherein semiconductor defect classification device is further configured to perform the defect classification on the images by using the aligned low resolution image, the aligned reference image, the first meta information, the second meta information, and third meta information.

* * * * *